(12) United States Patent
Nomura

(10) Patent No.: US 6,215,340 B1
(45) Date of Patent: Apr. 10, 2001

(54) SIGNAL TRANSITION ACCELERATING DRIVER WITH SIMPLE CIRCUIT CONFIGURATION AND DRIVER SYSTEM USING THE SAME

(75) Inventor: Masahiro Nomura, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/251,730

(22) Filed: Feb. 18, 1999

(30) Foreign Application Priority Data

Feb. 18, 1998 (JP) .................................................. 10-052723

(51) Int. Cl.⁷ ..................................................... H03K 17/16
(52) U.S. Cl. ............................ 327/112; 327/389; 326/17; 326/28; 326/82
(58) Field of Search ..................................... 327/374, 384, 327/386, 389, 108, 112; 326/17, 18, 26–28, 82, 83, 86, 87

(56) References Cited

U.S. PATENT DOCUMENTS

| | | | |
|---|---|---|---|
| 5,311,084 | 5/1994 | Gabara | 327/170 |
| 5,440,182 * | 8/1995 | Dobbelaere | 326/38 |
| 5,594,374 | 1/1997 | Oh | 327/108 |
| 5,686,853 | 11/1997 | Lima et al. | 327/374 |
| 5,698,994 * | 12/1997 | Tsuji | 326/83 |
| 5,841,300 | 11/1998 | Murabayashi et al. | 326/98 |
| 5,877,647 * | 3/1999 | Vajapey et al. | 327/391 |
| 6,031,388 * | 2/2000 | Dobbelaere | 326/17 |

FOREIGN PATENT DOCUMENTS

| | | |
|---|---|---|
| 2-138612 | 5/1990 | (JP) . |
| 5-55893 | 3/1993 | (JP) . |
| 6-59757 | 3/1994 | (JP) . |
| 6-112802 | 4/1994 | (JP) . |
| 7-288465 | 10/1995 | (JP) . |
| 8-102655 | 4/1996 | (JP) . |
| 8-116249 | 5/1996 | (JP) . |
| 8-186482 | 7/1996 | (JP) . |
| 9-50693 | 2/1997 | (JP) . |
| 10-190436 | 7/1998 | (JP) . |
| 11-55094 | 2/1999 | (JP) . |

OTHER PUBLICATIONS

T. Iima et al., "Symposium on VLSI Circuits Digest of Technical Papers" 4–4, Capacitance Coupling Immune, Transient Sensitive Accelerator for Resistive Interconnection, Signals of Sub–quarter Micron ULSI, pp. 31 and 32, (1995).

* cited by examiner

*Primary Examiner*—Tuan T. Lam
(74) *Attorney, Agent, or Firm*—Foley & Lardner

(57) ABSTRACT

A signal transition accelerating driver circuit firstly charges a signal line to a precharging level, thereafter, maintains the precharging level or discharges the signal line depending upon the potential level of the data/bus status signal, for this reason, any gate circuit is required, and the circuit configuration is simple.

24 Claims, 12 Drawing Sheets

US 6,215,340 B1

SIGNAL TRANSITION ACCELERATING DRIVER WITH SIMPLE CIRCUIT CONFIGURATION AND DRIVER SYSTEM USING THE SAME

FIELD OF THE INVENTION

This invention relates to a driver circuit for a signal line and, more particularly, to a signal transition accelerating driver of the type driving a signal line in response to an input data signal and accelerating the potential level on the signal line.

DESCRIPTION OF THE RELATED ART

In an electric circuit, a signal line usually has a large time constant, and the large time constant renders the signal transition on the signal line gentle. In order to speed up the signal transition, a signal transition accelerating driver is connected to the signal line. A typical example of the signal transition accelerating driver is disclosed in "Capacitance Coupling Immune, Transient Sensitive Accelerator for Resistive Interconnection Signals of Sub-quarter Micron ULSI", 1995 Symposium on VLSI Circuits Digest of Technical Papers, and another example is disclosed in Japanese Patent Publication of Unexamined Application No. 8-186482. These examples detect a signal transition, and accelerate it.

A bus system is associated with plural signal transition accelerating drivers as disclosed in Japanese Patent Publication of Unexamined Application No. 9-50693. The signal transition accelerating drivers are selectively activated for driving bus lines, and non-selected signal transition accelerating drivers assists the signal transition on the bus line.

Other related arts already known are described in Japanese Patent Publication of Unexamined Application Nos. 6-59757 and 8-102655. The prior art disclosed in Japanese Patent Publication of Unexamined Application No. 6-59757 relates to a voltage controlled buffer circuit. Japanese Patent Publication of Unexamined Application No. 6-59757 is corresponding to Japanese Patent Application No. 5-172072, and the Japanese Patent Application claimed the convention priority from U.S. Ser. No. 08/902,614. The voltage controlled buffer circuit samples the voltage on a signal line, and compares the sampled voltage with a reference voltage for producing a control signal. With the control signal, the voltage controlled buffer circuit controls the signal rise time and the signal decay time on the associated signal line in order to keep the signal driving speed constant. Another prior art disclosed in Japanese Patent Publication of Unexamined Application No. 8-102655 relates to a bus line driver incorporated in a semiconductor memory device, and a voltage controller is incorporated in the bus line driver. The voltage controller changes the bus line to an intermediate voltage before a signal transition in order to reduce the load of the bus line driver.

FIG. 1 illustrates a prior art signal transition accelerating bus driver. The prior art signal transition accelerating bus driver is broken down into an output driver 1, a gate circuit 2 and a signal transition accelerator 3. A p-channel enhancement type field effect transistor Qp1 and an n-channel enhancement type field effect transistor Qn1 are connected in series between a high level line 4 and a low level line 5, and the series combination of the p-channel enhancement type field effect transistor Qp1 and the n-channel enhancement type field effect transistor Qn1 serves as the output driver 1. The p-channel enhancement type field effect transistor Qp1 and the n-channel enhancement type field effect transistor Qn1 complementarily turn on and off, and supply the high level or the low level to a bus line 6.

The gate circuit 2 includes two transfer gates 7/8 and an inverter 9. The transfer gates 7 and 8 are connected between a data line 10 and the gate electrodes of the field effect transistors Qp1/Qn1. An enable signal line 11 is connected to the inverter 9 and the first control nodes of the transfer gates 7/8, and the inverter 9 is connected to the second control nodes of the transfer gates 7/8. The enable signal line 11 propagates an enable signal EBL1 to the first control nodes of the transfer gates 7/8, and the inverter 9 supplies the inverted signal CEBL1 of the enable signal EBL1 to the second control nodes of the transfer gates 7/8. When the enable signal EBL1 is in the high level, the transfer gates 7/8 turn on, and a data signal Sin is transferred through the transfer gates 7/8 to the gate electrodes of the field effect transistors Qp1/Qn1.

The signal transition accelerator 3 includes a NAND gate 12, a NOR gate 13, delay circuits 14/15 and transfer gates 16/17. The NAND gate 12 has two input nodes one of which is directly connected to the bus line 6 and the other of which is connected through the delay circuit 14 to the bus line 6. Similarly, the NOR gate 13 has two input nodes one of which is directly connected to the bus line 6 and the other of which is connected through the delay circuit 15 to the bus line 6. The output node of the NAND gate 12 is connected through the transfer gate 16 to the gate electrode of the p-channel enhancement type field effect transistor Qp1, and the output node of the NOR gate 13 is connected through the transfer gate 17 to the gate electrode of the n-channel enhancement type field effect transistor Qn1. Each of the delay circuits 14/15 is implemented by an odd number of inverters connected in series, and both delay circuits 14/15 introduce a predetermined delay time into the propagation of a potential level on the bus line 6. The potential level on the bus line 6 is propagated to the other end of the bus line 6 as a data signal Sout, and returns to the signal transition accelerator 3 as a bus status signal BS1. The delay circuits 14/15 supply an inverted signal CBS1 to the other input node of the NAND gate 12 and the other input node of the NOR gate 13. The NAND gate 12 and the NOR gate 13 offer a feedback loop to the gate electrode of the p-channel enhancement type field effect transistor Qp1 or the gate electrode of the n-channel enhancement type field effect transistor Qn1 depending upon the voltage level of the bus status signal BS1. The inverter 9 supplies the inverted signal CEBL1 to the first control nodes of the transfer gates 16/17, and the enable signal line 11 supplies the enable signal EBL1 to the second control nodes of the transfer gates 16/17. When the enable signal EBL1 is in the low level, the transfer gates 16/17 turn on, and the NAND gate 12 and the NOR ate 13 are connected through the transfer gate 16 to the gate electrode of the p-channel enhancement type field effect transistor Qp1 and through the transfer gate 17 to the gate electrode of the n-channel enhancement type field effect transistor Qn1. Thus, one of the gate circuit 2 and the signal transition accelerator 3 drives the output driver 1 depending upon the voltage level of the enable signal EBL1.

Description is firstly made on the driving operation on the bus line 6 in response to the data signal Sin. The data signal Sin and the data signal Sout are assumed to be in the high level and in the low level, respectively. Accordingly, the bus status signal BS1 and the inverted signal CBS1 is in the low level and in the high level, respectively.

The enable signal EBL1 is firstly changed to the high level. The enable signal EBL1 causes the transfer gates 7/8 and the transfer gates 16/17 to turn on and off, respectively.

The data signal Sin is changed from the high level to the low level, and the potential change is transferred to the gate electrode of the p-channel enhancement type field effect transistor Qp1 and the gate electrode of the n-channel enhancement type field effect transistor Qn1. The data signal Sin gives rise to decrease the potential level at the gate electrode of the p-channel enhancement type field effect transistor Qp1 and the gate electrode of the n-channel enhancement type field effect transistor Qn1. The p-channel enhancement type field effect transistor Qp1 is varied toward the on-state, and the n-channel enhancement type field effect transistor Qn1 is varied toward the off-state. The p-channel enhancement type field effect transistor Qp1 starts to flow electric current from the high level line 4 to the bus line 6. The electric current raises the potential level on the bus line 6, and, accordingly, the output signal Sout is changed from the low level to the high level.

When the data signal Sin is changed from the low level to the high level, the p-channel enhancement type field effect transistor Qp1 turns off, and the n-channel enhancement type field effect transistor Qn1 turns on. As a result, the bus line 6 goes down to the low level.

If the enable signal EBL1 is changed to the low level, the prior art signal transition accelerating bus driver becomes responsive to the potential level on the bus line 6. The enable signal EBL1 causes the transfer gates 7/8 and the transfer gates 16/17 to turn off and on, respectively. As a result, the gate electrode of the p-channel enhancement type field effect transistor Qp1 and the gate electrode of the n-channel enhancement type field effect transistor Qn1 are electrically isolated from the data line 10.

The potential level on the bus line 6 is assumed to rise toward the high level. The delay circuits 14/15 keep the inverted signals CBS1 in the high level. When the potential level on the bus line 6 exceeds the threshold of the NAND/NOR gates 12/13, the bus status signal BS1 enables the NAND gate 12, and disables the NOR gate 13. The NOR gate 13 supplies the low level through the transfer gate 17 to the gate electrode of the n-channel enhancement type field effect transistor Qn1, and the n-channel enhancement type field effect transistor Qn1 turns off.

The bus status signal BS1 and the inverted signal CBS1 make both input nodes of the NAND gate 12 high. The NAND gate 12 changes the output node to the low level. The low level is transferred through the transfer gate 16 to the gate electrode of the p-channel enhancement type field effect transistor Qp1, and the p-channel enhancement type field effect transistor is changed to the on-state. As a result, the electric current flows through the p-channel enhancement type field effect transistor Qp1 to the bus line 6, and the output driver 1 changes the data signal Sout to the high level. Thus, the signal transition accelerator 3 offers the loop from the bus line 6 through the NAND gate 12 to the gate electrode of the p-channel enhancement type field effect transistor Qp1, and accelerates the potential rise on the bus line 6.

After the predetermined lapse of time, the inverted signal CBS1 is changed to the low level, and the NAND gate 12 changes the output node thereof to the high level. The p-channel enhancement type field effect transistor Qp1 is changed to the off-state. Thus, the loop is available for the acceleration for the predetermined delay time of the delay circuit 14.

While the potential level on the bus line 6 is falling from the high level to the low level, the NOR gate changes the output node thereof to the high level for the predetermined lapse of time, and the signal transition accelerator 3 offers the loop from the bus line 6 through the NOR gate 13 to the gate electrode of the n-channel enhancement type field effect transistor Qn1. The loop is also available for the acceleration for the predetermined delay time of the delay circuit 15.

A problem is encountered in the prior art signal transition accelerating bus driver in the complicated circuit configuration. The prior art signal transition accelerating bus driver requires the transfer gates 7/8 and 16/17 in order to change the signal source between the data line 10 and the bus line 6, and the two series of inverters 14/15 in order to define the time period for the acceleration. Those circuit components make the prior art signal transition accelerating bus driver complicated.

SUMMARY OF THE INVENTION

It is therefore an important object of the present invention to provide a signal transition accelerating driver circuit, which has a simple circuit configuration.

It is also an important object of the present invention to provide a driving system, which has plural signal transition accelerating driver circuits with the simple circuit configuration selectively participating a driving operation in response to a data signal and an acceleration of the potential change on the signal line.

In accordance with one aspect of the present invention, there is provided a signal transition accelerating driver circuit comprising an output driver connected between two sources of potential level different in potential level and a signal line to be driven and having a first phase of operation for giving a preliminary level to the signal line in response to a first control signal and a second phase of operation for fixing the signal line to the potential level of one of the two sources in response to a second control signal, and a controller changing the first control signal between a first level indicative of the first phase of operation and a second level indicative of the second phase of operation, and responsive to a third control signal of a third level for producing the second control signal on the basis of a data signal and to the third control signal of a fourth level for producing the second control signal on the basis of a potential level on the signal line.

In accordance with another aspect of the present invention, there is provided a driver system for changing a potential level on a signal line, comprising at least one first driver circuit including a first output driver connected between two sources of potential level different in potential level and the signal line to be driven and having a first phase of operation for giving a preliminary level to the signal line in response to a first control signal and a second phase of operation for fixing the signal line to the potential level of one of the two sources in response to a second control signal and a first controller changing the first control signal between a first level indicative of the first phase of operation and a second level indicative of the second phase of operation and responsive to a third control signal of a third level for producing the second control signal on the basis of a first data signal and to the third control signal of a fourth level for producing the second control signal on the basis of a potential level on the signal line, at least one second driver circuit including a second output driver connected between the two sources of potential level and the signal line and having the first phase for giving said preliminary level to the signal line in response to the first control signal and the second phase of operation for fixing the signal line to the potential level of one of the two sources in response to a fourth control signal, and a second controller changing the first control signal between the first level and the second level and responsive to a fifth control signal of the fourth level for producing the second control signal on the basis of the potential level on the signal line, and at least one third driver circuit including a third output driver connected between the two sources of potential level and the signal line and having the first phase for giving the preliminary level to the signal line in response to a fifth control signal and the second phase of operation for fixing the signal line to the potential level of one of the two sources in response to a sixth control signal, and a third controller changing the fifth control signal between the first level and the second level and responsive to a sixth control signal complementary to the third control signal and having the third level for producing the sixth control signal on the basis of a second data signal and the fourth level for producing the fifth control signal on the basis of the potential level on the signal line.

BRIEF DESCRIPTION OF THE DRAWINGS

The features and advantages of the signal transition accelerating driver circuit will be more clearly understood from the following description taken in conjunction with the accompanying drawings in which.

DESCRIPTION OF THE PREFERRED EMBODIMENTS

First Embodiment

Figure 1:
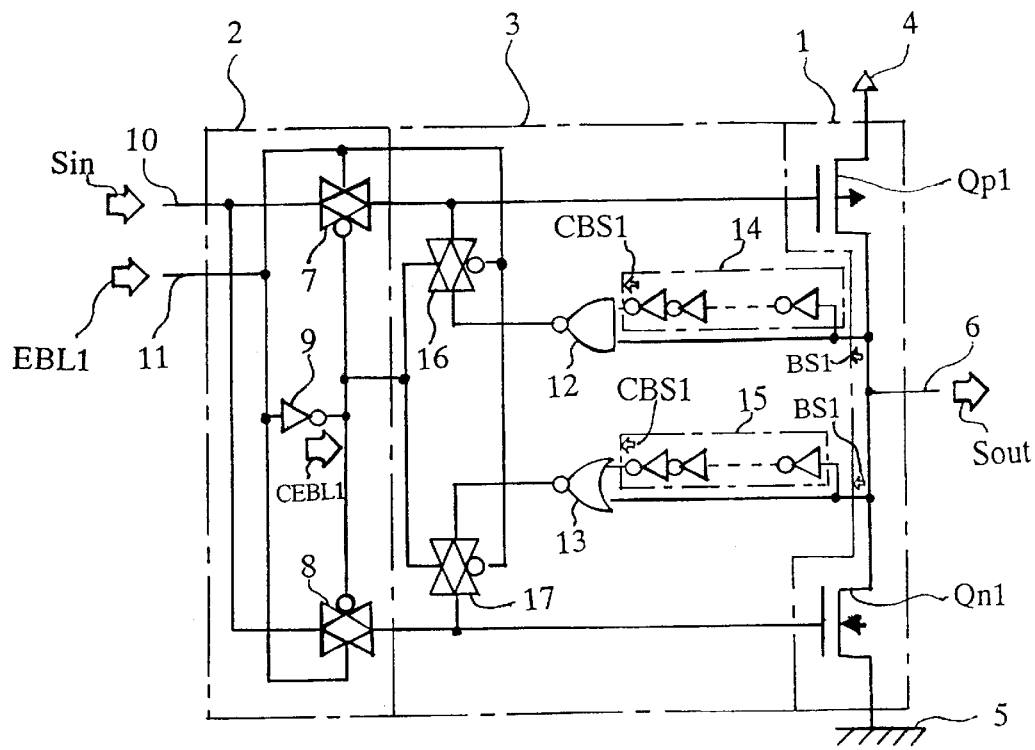
FIG. 1 is a logic diagram showing the circuit configuration of the prior art signal transition accelerating bus driver.
Figure 2:
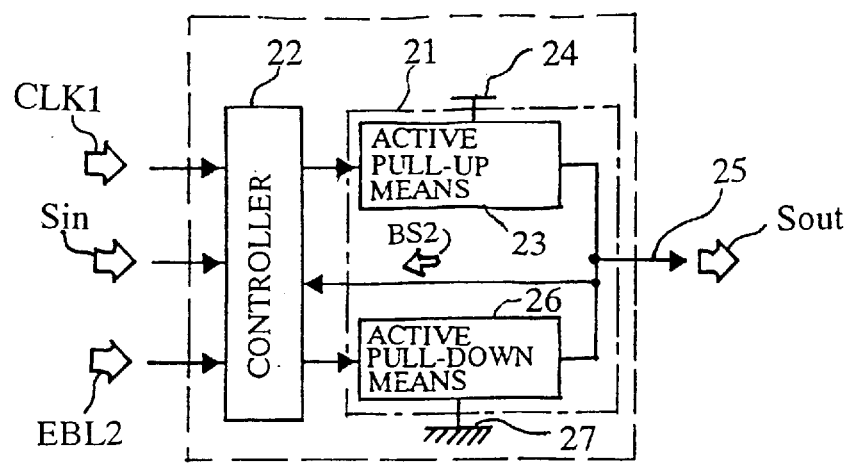
FIG. 2 is a block diagram showing the circuit configuration of a signal transition accelerating driver circuit according to the present invention.

Referring to FIG. 2 of the drawings, a signal transition accelerating driver circuit embodying the present invention largely comprises an output driver 21 and a controller 22. The output driver 21 includes an active pull-up means 23 connected between a high voltage line 24 and a signal line 25 to be driven and an active pull-down means 26 connected between the signal line 25 and a low voltage line 27. The controller 22 instructs the active pull-up means 23 and the active pull-down means 26 to selectively connect the high voltage line 24 and the low voltage line 27 to the signal line 25, and the output driver 21 changes the voltage level on the signal line 25 between the high level and the low level. The voltage level is propagated through the signal line 25 to a destination as an output signal Sout, and returns to the controller 22 as a bus status signal BS2.

A clock signal CLK11, a data signal Sin, an enable signal EBL2 and the bus status signal BS2 are supplied to the controller 22. The clock signal CLK1 changes the signal transition accelerating driver between a precharging mode and a sampling mode. In this instance, while the clock signal CLK1 is staying in the high level, the signal transition accelerating driver circuit behaves in the precharging mode, and the controller 22 instructs the active pull-up means 23 to charge the signal line 25 to the high level regardless of the data signal Sin and the bus status signal BS2. When the clock signal CLK1 is changed to the low level, the signal transition accelerating driver circuit enters into the sampling mode, and the controller 22 is responsive to one of the data signal Sin and the bus status signal BS2 depending upon the voltage level of the enable signal EBL2.

If the enable signal EBL2 stays at the high level in the sampling mode, the controller 22 checks the data signal Sin to see whether or not the active pull-down means 26 is to discharge the signal line 25, and instructs the pull-down means 26 to discharge the signal line 25 or isolate it from the low level line 27.

On the other hand, if the enable signal EBL2 stays at the low level in the sampling mode, the controller checks the bus status signal BS2 to see whether or not the active pull-down means 26 is to discharge the signal line 25, and instructs the pull-down means 26 to discharge the signal line 25 or isolate it from the low level line 27.

Thus, the signal transition accelerating driver circuit does not require the gate circuit 2, and the circuit configuration thereof is simpler than that of the prior art signal transition accelerating bus driver.

Figure 3:
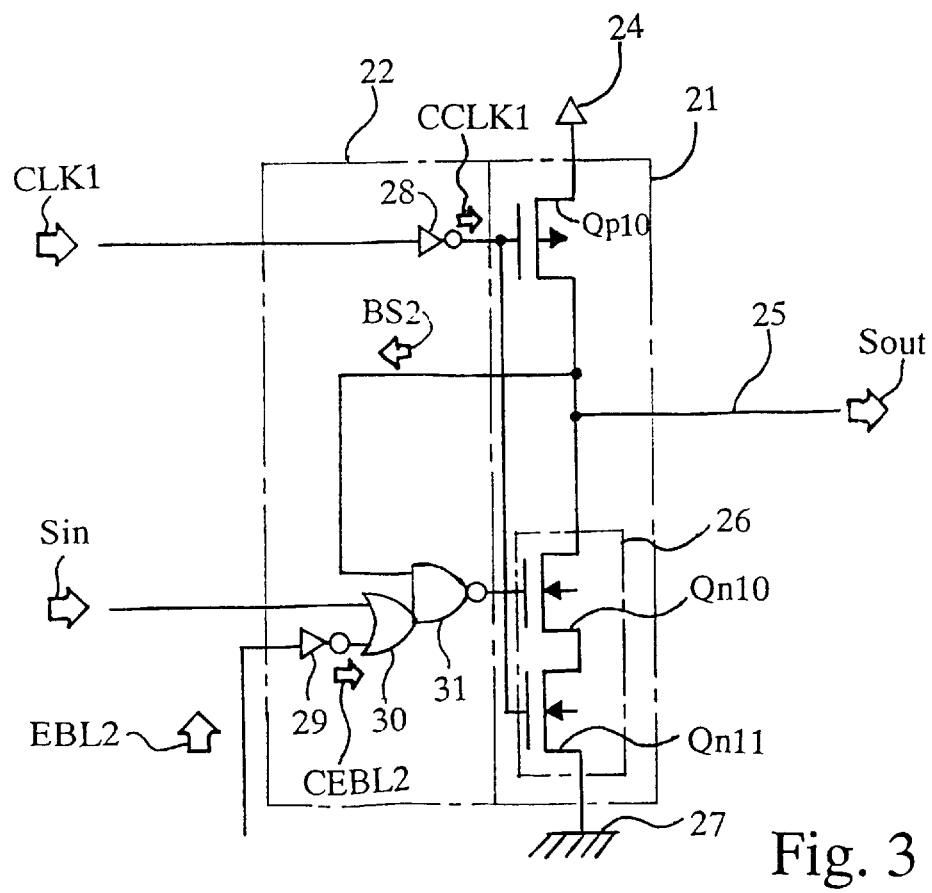
FIG. 3 is a logic diagram showing the circuit configuration of the signal transition accelerating driver circuit in detail.

FIG. 3 details the circuit configuration of the signal transition accelerating driver circuit. The active pull-up means 23 is implemented by a p-channel enhancement type field effect transistor Qp10, and a series of n-channel enhancement type field effect transistors Qn10/Qn11 serves as the active pull-down means 26.

The controller 22 includes two inverters 28/29, an OR gate 30 and a NAND gate 31. The clock signal CLK1 is supplied to the inverter 28, and the inverted clock signal CCLK1 is supplied to the gate electrode of the p-channel enhancement type field effect transistor Qp10 and the gate electrode of the n-channel enhancement type field effect transistor Qn11. For this reason, when the clock signal CLK1 is changed to the high level, the inverted clock signal CCLK1 of the low level causes the p-channel enhancement type field effect transistor Qp10 to turn on in order to supply electric current to the signal line 25, and the n-channel enhancement type field effect transistor Qn11 turns off in order to isolate the signal line 25 from the low level line 27. On the other hand, when the clock signal CLK1 is changed to the low level, the inverted clock signal CCLK1 causes the p-channel enhancement type field effect transistor Qp10 to turn off, and the n-channel enhancement type field effect transistor Qn11 turns on. As a result, the active pull-down means 26 becomes ready for discharging.

The enable signal EBL2 is supplied to the other inverter 29, and the inverted enable signal CEBL2 is supplied from the inverter 29 to the OR gate 30. When the enable signal EBL2 is changed to the high level, the inverted enable signal CEBL2 allows the OR gate 30 to respond to the data signal Sin. The NAND gate 31 has been already enabled through the precharging operation, and is responsive to the voltage level at the output node of the OR gate 30. The NAND gate 31 changes the n-channel enhancement type field effect transistor Qn10 between the on-state and the off-state.

On the other hand, when the enable signal EBL2 is changed to the low level, the inverted enable signal CEBL2 causes the OR gate 30 to fix the output node thereof to the high level, and the NAND gate 31 is enabled with the high level at the output node of the OR gate 31. As a result, the NAND gate 31 responds to the bus status signal BS2, and changes the n-channel enhancement type field effect transistor Qn10 between the on-state and the off-state.

Thus, the signal transition accelerating driver circuit does not require the delay circuits 14/15, and the circuit configuration is simpler than that of the prior art signal transition accelerating bus driver.

Figure 4:
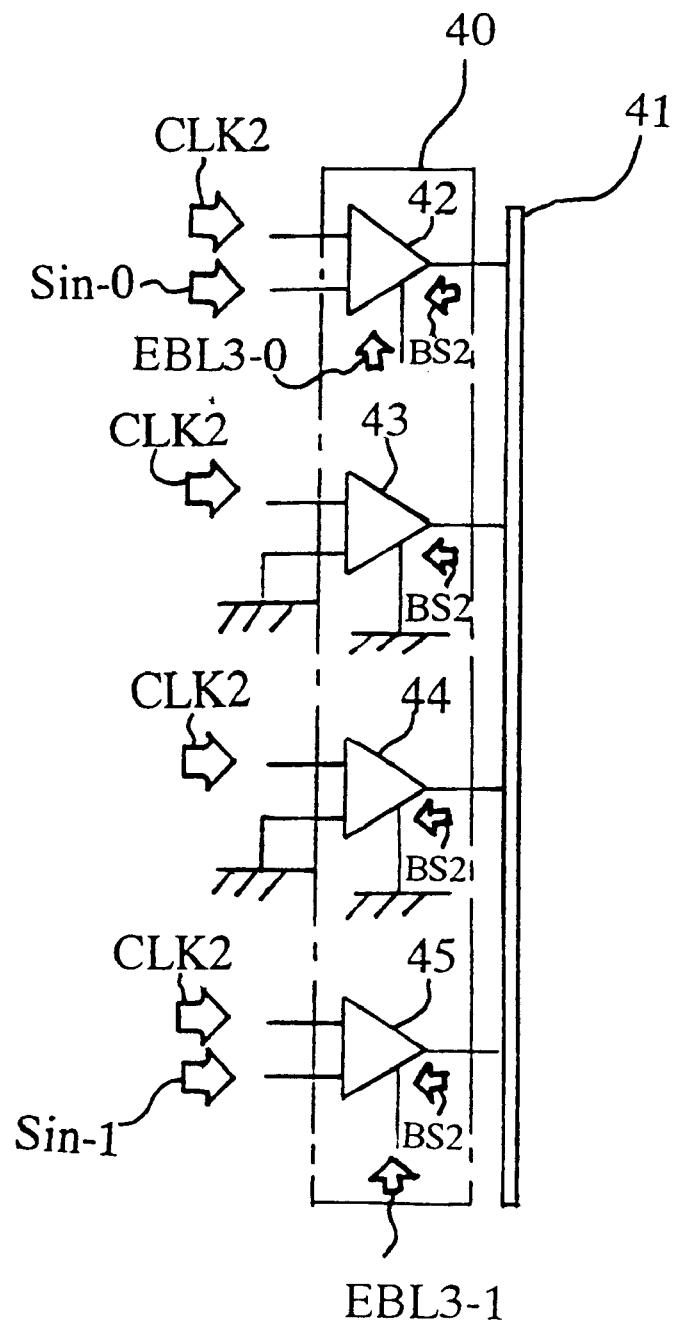
FIG. 4 is a schematic view showing a driving system according to the present invention.

Using the signal transition accelerating driver circuit, a bus driving system 40 is constructed as shown in FIG. 4. The bus driving system 40 drives a bus line 41, and includes four signal transition accelerating driver circuits 42/43/44/45. The signal transition accelerating driver circuits 42/43/44/45 have the same circuit configuration as the signal transition accelerating driver circuit shown in FIGS. 2 and 3. For this reason, the circuit components of each signal transition accelerating driver circuit 42/43/44/45 are designated by using the references designating corresponding circuit components of the signal transition accelerating driver circuit shown in FIGS. 2 and 3.

A clock signal CLK2 is supplied to all the signal transition accelerating driver circuits 42–45. Data signals Sin-0 and Sin-1 are supplied to the OR gates 30 of the signal transition accelerating driver circuits 42/45, respectively, and enable signals EBL3-0 and EBL3-1 are supplied to the inverters 29 of the signal transition accelerating driver circuits 42/45, respectively. However, the other signal transition accelerating driver circuits 43/44 are supplied with the low level or logic "0" level instead of the data signal Sin and the enable signal EBL2.

Figure 5:
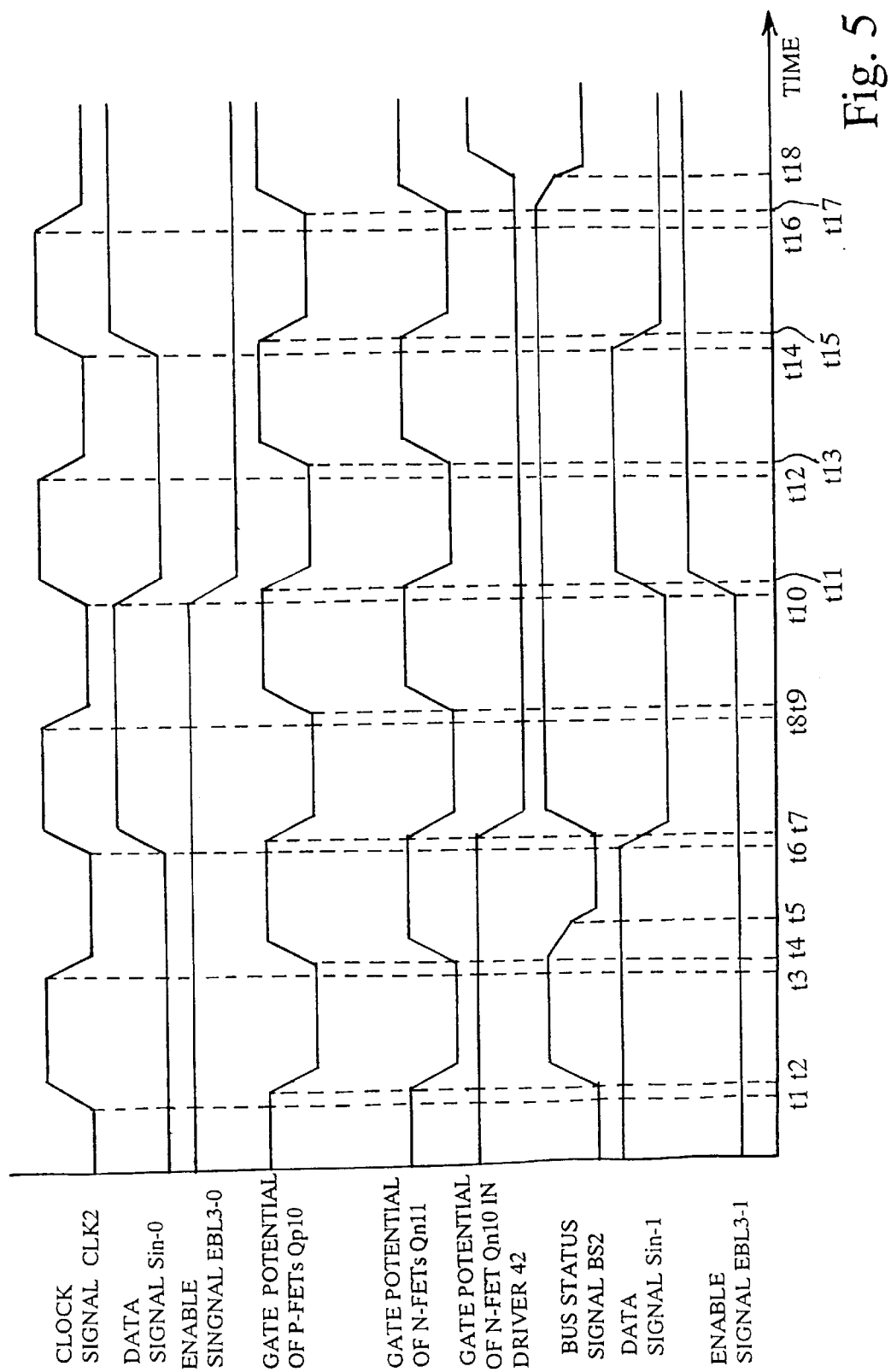
FIG. 5 is a timing chart showing the waveforms of essential signals in the driving system.

The bus driving system 40 behaves as shown in FIG. 5. The clock signal CLK2 periodically rises at time t1, t6, t10 and t14, and falls at time t3, t8, t12 and t16. As described hereinbefore, the clock signal CLK2 causes the signal transition accelerating driver circuits 42 to 45 to alternately enter into the precharging period and the sampling period.

When the clock signal CLK2 is changed to the high level, the signal transition accelerating driver circuits 42 to 45 enter into the precharging period, and the inverters 28 supply the low level to the gate electrodes of the associated p-channel enhancement type field effect transistors Qp10 and the gate electrodes of the associated n-channel enhancement type field effect transistors Qn11. Accordingly, the gate potentials of the field effect transistors Qp10/Qn11 go down to the low level at time t2, t7, t11 and t15, and the bus line 41 is connected through the p-channel enhancement type field effect transistors Qp10 to the high voltage line 24. Thus, the bus line 41 is charged to the high level in the precharging period.

On the other hand, when the clock signal CLK2 falls down to the low level, the signal transition accelerating driver circuits 42–45 start the sampling period, and the inverters 28 change the gate potential of the p-channel enhancement type field effect transistors Qp10 and the gate potential of the n-channel enhancement type field effect transistors Qn11. As a result, each of the signal transition accelerating driver circuits 42/45 becomes responsive to the data signal Sin-0/Sin-1 or the bus status signal BS2 depending upon the voltage level of the associated enable signal EBL3-0/EBL3-1. However, the other signal transition accelerating driver circuits 43/44 are always responsive to the bus status signal BS2 in the sampling periods.

The enable signal EBL3-0 starts to change the potential level from the high level to the low level at time t10, and the other enable signal EBL3-1 concurrently starts to rise to the high level. Therefore, the signal transition accelerating driver circuit 42 is responsive to the associated data signal Sin-0 in the sampling periods before time t10, and the signal transition accelerating driver circuit 45 drives the bus line 41 in response to the data signal Sin-1 after time t10. While the signal transition accelerating driver circuit 42 is driving the bus line 41, the other signal transition accelerating driver circuits 43–45 accelerate the signal transition on the bus line 41. On the contrary, while the signal transition accelerating driver circuit 45 is driving the bus line 41, the other signal transition accelerating driver circuits 42 to 44 accelerate the signal transition on the bus line 41.

In the sampling period from time t3 to time t6, the data signal Sin-0 is in the low level, and the signal transition accelerating driver circuit 42 makes the n-channel enhancement type field effect transistor Qn10 thereof turn on. Accordingly, the potential level on the bus line 41 is gently decayed until time t5. The potential level on the bus line 41 or the bus status signal BS2 becomes lower than the threshold of the NAND gates 31 of the signal transition accelerating driver circuits 43 to 45 at time t5, and the other signal transition accelerating driver circuits 43 to 45 make the n-channel enhancement type field effect transistors Qn10 thereof turn on. As a result, the bus status signal BS2 is rapidly decayed, and reaches the low level.

The data signal Sin-0 starts to rise at time t6, and all the signal transition accelerating drivers 42 to 45 enter into the precharging period. The bus line 41 is charged to the high level. The clock signal CLK2 starts to change the potential level to the low level at time t8, and all the signal transition accelerating driver circuits 42 to 45 enter into the sampling period. The signal transition accelerating driver circuit 42 responds to the data signal Sin-0 of the high level, and keeps the n-channel enhancement type field effect transistor Qn10 in the off-state from time t8 to time t10.

After time t10, the signal transition accelerating driver circuit 45 drives the bus line 41. All the signal transition accelerating driver circuits 42–45 enter into the sampling period at time t12. The signal transition accelerating driver circuit 45 responds to the data signal Sin-1 of the high level, and keeps the n-channel enhancement type field effect transistor Qn10 in the off-state. For this reason, the bus status signal BS2 is staying at the high level from time t12 to time t14.

All the signal transition accelerating driver circuits 42–45 connect the bus line 41 to the high voltage line 24 in the precharging period from time t14 to time t16. The bus line 41 has been already changed to the high level before the next sampling period, and the data signal Sin-1 was changed to the low level at time t14. All the signal transition accelerating driver circuits 42 to 45 enter into the sampling period at time t16. The signal transition accelerating driver circuit 45 changes the n-channel enhancement type field effect transistor Qn10 to the on-state, and the bus line 41 is discharged through the n-channel enhancement type field effect transistor Qn10 of the signal transition accelerating driver circuit 45. For this reason, the bus status signal BS2 is gently decayed from time t17 to time t18. The bus status signal BS2 exceeds the threshold of the NAND gate 31 of the other signal transition accelerating driver circuits 42 to 44, and the other signal transition accelerating driver circuits 42 to 44 participate the potential decay on the bus line 41. For this reason, the bus status signal BS2 rapidly falls from time t18.

As will be understood from the foregoing description, the signal transition accelerating driver circuits 42–45 charge the bus line 41 in the precharging period, one of the signal transition accelerating driver circuits 42/45 drives the bus line 41 in response to the associated data signal Sin-0/Sin-1 depending upon the voltage level of the enable signals EBL3-0/EBL3-1, and the other signal transition accelerating driver circuits 45/42, 43 and 44 participate the potential decay on the bus line 41. Thus, the signal transition accelerating driver circuit with the simple circuit configuration surely achieves the job assigned through the enable signal EBL3-0/EBL3-1.

Second Embodiment

Figure 6:
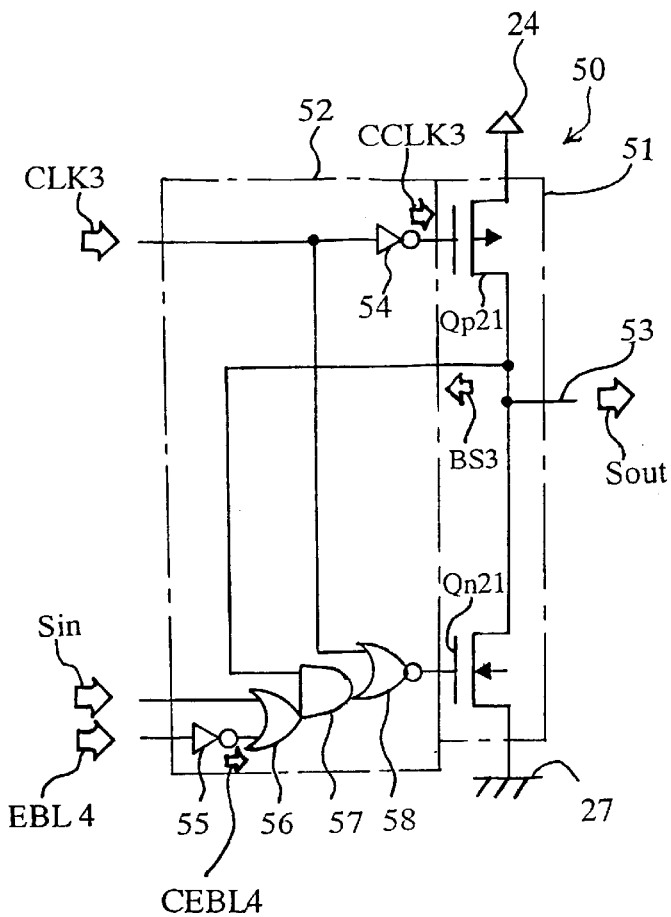
FIG. 6 is a logic diagram showing the circuit configuration of another signal transition accelerating driver circuit according to the present invention.

FIG. 6 illustrates another signal transition accelerating driver circuit 50 embodying the present invention. The signal transition accelerating driver circuit 50 largely comprises an output driver 51 and a controller 52. A series combination of a p-channel enhancement type field effect transistor Qp21 and an n-channel enhancement type field effect transistor Qn21 serves as the output driver 51, and the p-channel enhancement type field effect transistor Qp21 and the n-channel enhancement type field effect transistor Qn21 are corresponding to the active pull-up means 23 and the active pull-down means 26, respectively. A signal line 53 is connected to the common drain node between the p-channel enhancement type field effect transistor Qp21 and the n-channel enhancement type field effect transistor Qn21.

The controller 52 includes inverters 54/55, an OR gate 56, an AND gate 57 and a NOR gate 58. A clock signal CLK3 is supplied to the inverter 54, and the inverter 54 controls the p-channel enhancement type field effect transistor Qp21 with the inverted clock signal CCLK3. An enable signal EBL4 is supplied to the other inverter 55, and the inverter 55 supplies an inverted signal CEBL4 of the enable signal EBL4 to one input node of the OR gate 56. A data signal is supplied to the other input node of the OR gate 56. The inverted signal CEBL4 is ORed with the data signal Sin, and the OR gate 56 supplies the output signal to one end of the AND gate 57. A bus status signal BS3 is supplied to the other input node of the AND gate 57, and is ANDed with the output signal of the OR gate 56. The AND gate 57 supplies the output signal to one input node of the NOR gate 58, and the output signal of the AND gate 57 is NORed with the clock signal CLK3. The NOR gate 58 supplies the output signal thereof to the gate electrode of the n-channel enhancement type field effect transistor Qn21. Thus, the inverter 55, the OR gate 56, the AND gate 57 and the NOR gate 58 controls the n-channel enhancement type field effect transistor Qn21.

The signal transition accelerating driver circuit 50 alternately enters into a precharging period and a sampling period, and is responsive to either data or bus status signal Sin/BS3 depending upon the voltage level of the enable signal EBL4 in the sampling period.

While the clock signal CLK3 is staying in the high level, the signal transition accelerating driver circuit 50 is in the precharging period. The clock signal CLK3 of the high level causes the NOR gate 58 to fix the output signal thereof to the low level, and the n-channel enhancement type field effect transistor Qn21 is turned off. On the other hand, the inverter 54 supplies the inverted signal CCLK3 of the low level to the p-channel enhancement type field effect transistor Qp21, and the p-channel enhancement type field effect transistor Qp21 charges the signal line 53 to the high level.

On the contrary, when the clock signal CLK3 is changed to the low level, the inverter 54 supplies the inverted signal CCLK3 to the p-channel enhancement type field effect transistor Qp21, and the inverted signal CCLK3 makes the p-channel enhancement type field effect transistor Qp21 to turn off. The clock signal CLK3 of the low level is directly supplied to the NOR gate 58, and the NOR gate 58 is enabled with the clock signal CLK3.

If the enable signal EBL4 is in the high level, the inverter 55 supplies the inverted signal CEBL4 of the low level, and the inverted signal CEBL4 enables the OR gate 56. Upon completion of the precharging period, the bus status signal BS3 is in the high level, and the AND gate 57 is enabled with the bus status signal BS3. Thus, the OR gate 56, the AND gate 57 and the NOR gate 58 are enabled. As a result, the data signal Sin is transferred through the OR gate 56 and the AND gate 57 to the NOR gate 58, and the NOR gate 58 supplies the inverted signal of the data signal Sin to the n-channel enhancement type field effect transistor Qn21.

If the enable signal EBL4 is in the low level, the inverted signal CEBL4 disables the OR gate 56, and the OR gate 56 fixes the output signal to the high level regardless of the data signal Sin. The output signal of the OR gate 56 enables the AND gate 57, and the AND gate 57 changes the output signal thereof in response to the bus status signal BS3. For this reason, the AND gate 57 and the NOR gate 58 control the n-channel enhancement type field effect transistor Qn21 in response to the bus status signal BS3.

Figure 7:
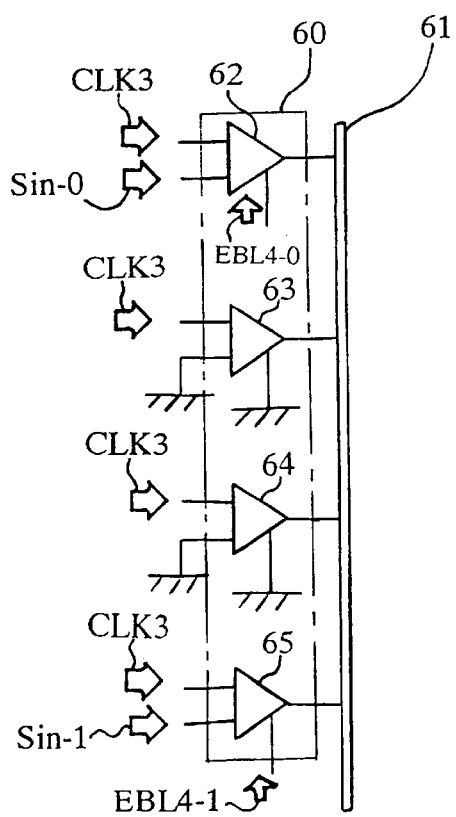
FIG. 7 is a schematic view showing another driving system according to the present invention.

Using the signal transition accelerating driver circuit 50, another bus driving system 60 is constructed as shown in FIG. 7. The bus driving system 60 is connected to a bus line 61, and includes four signal transition accelerating driver circuits 62/63/64/65. The signal transition accelerating driver circuits 62/63/64/65 have the same circuit configuration as the signal transition accelerating driver circuit 50. For this reason, the circuit components of each signal transition accelerating driver circuit 62/63/64/65 are designated by using the references designating the corresponding circuit components of the signal transition accelerating driver circuit 50.

The clock signal CLK3 is supplied to all the signal transition accelerating driver circuits 62–65. Data signals Sin-0 and Sin-1 are supplied to the OR gates 56 of the signal transition accelerating driver circuits 62/65, respectively, and enable signals EBL3-0 and EBL3-1 are supplied to the inverters 55 of the signal transition accelerating driver circuits 62/65, respectively. However, the other signal transition accelerating driver circuits 63/64 are supplied with the low level or logic "0" level instead of the data signal Sin and the enable signal EBL3.

Figure 8:
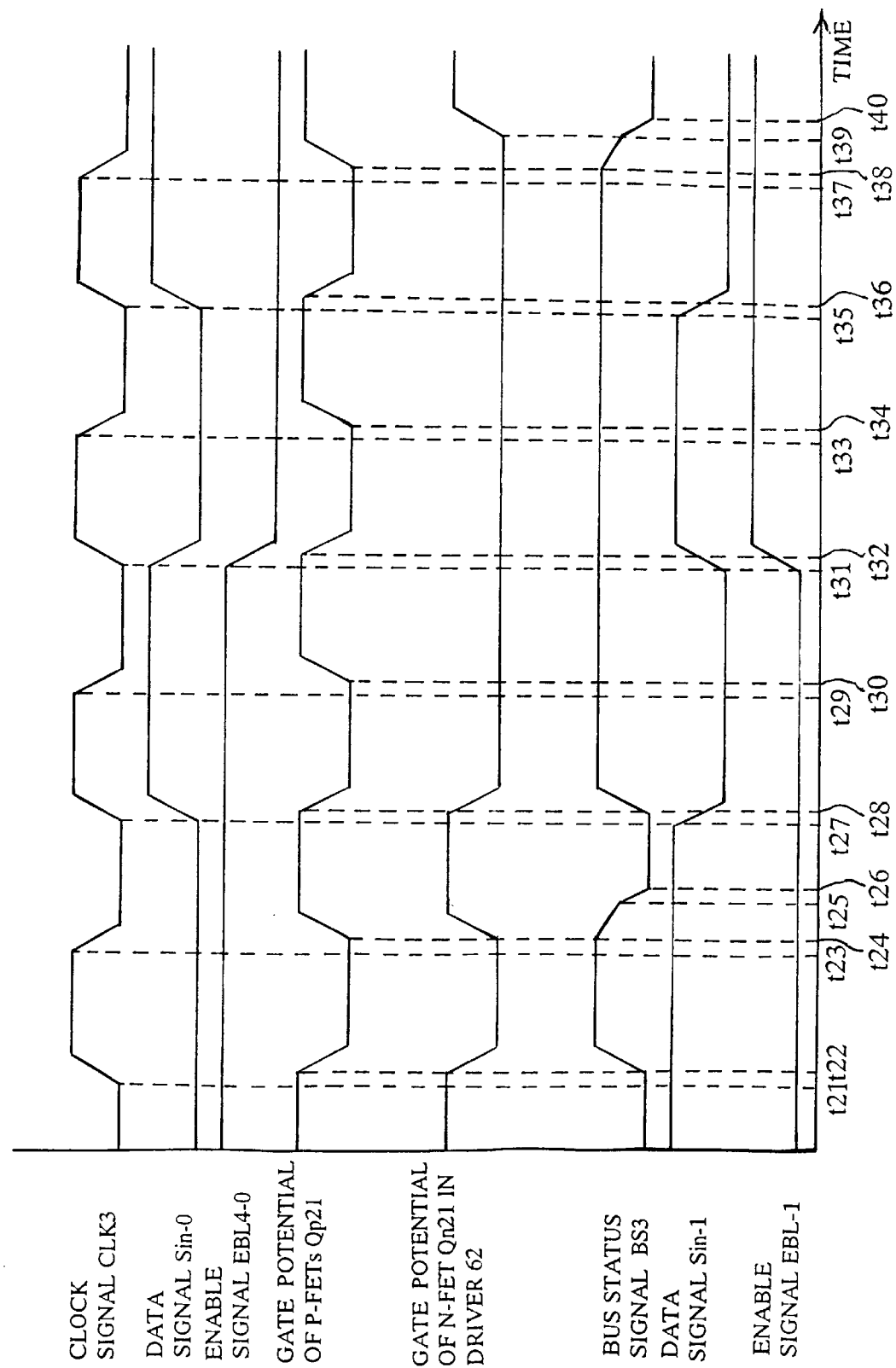
FIG. 8 is a timing chart showing the waveforms of essential signals in the driving system.

The bus driving system 60 behaves as shown in FIG. 8. The clock signal CLK3 periodically rises at time t21, t27, t31 and t35, and falls at time t23, t29, t33 and t37. As described hereinbefore, the clock signal CLK3 causes the signal transition accelerating circuits 62–65 alternately enter into the precharging period and the sampling period.

When the clock signal CLK3 is changed to the high level, the signal transition accelerating driver circuits 62 to 65 enter into the precharging period, and the inverters 54 supply the low level to the gate electrodes of the associated p-channel enhancement type field effect transistors Qp21. Accordingly, the gate potentials of the p-channel enhancement type field effect transistors Qp21 go down to the low level at time t22, t28, t32 and t36, and the bus line 61 is connected through the p-channel enhancement type field effect transistors Qp21 to the high voltage line 24. As a result, the potential level on the bus line 61 or the bus status signal BS3 goes up to the high level.

On the other hand, when the clock signal CLK3 falls down to the low level, the signal transition accelerating driver circuits 62–65 start the sampling period, and the inverters 54 change the gate potential of the p-channel enhancement type field effect transistors Qp21. As a result, each of the signal transition accelerating driver circuits 62/55 becomes responsive to the data signal Sin-0/Sin-1 or the bus status signal BS3 depending upon the voltage level of the associated enable signal EBL4-0/EBL4-1. However, the other signal transition accelerating driver circuits 63/64 are always responsive to the bus status signal BS2 in the sampling periods.

The enable signal EBL4-0 starts to change the potential level from the high level to the low level at time t31, and the other enable signal EBL4-1 concurrently starts to rise to the high level. Therefore, the signal transition accelerating driver circuit 62 is responsive to the associated data signal Sin-0 in the sampling periods before time t31, and the signal transition accelerating driver circuit 65 drives the bus line 61 in response to the data signal Sin-1 after time t31. While the signal transition accelerating driver circuit 62 is driving the bus line 61, the other signal transition accelerating driver circuits 63–65 accelerate the signal transition on the bus line 61. On the contrary, while the signal transition accelerating driver circuit 65 is driving the bus line 61, the other signal transition accelerating driver circuits 62 to 64 accelerate the signal transition on the bus line 61.

In the sampling period from time t23 to time t27, the data signal Sin-0 is in the low level, and the signal transition accelerating driver circuit 62 makes the n-channel enhancement type field effect transistor Qn21 thereof turn on. Accordingly, the potential level on the bus line 61 is gently decayed until time t25. The potential level on the bus line 61 or the bus status signal BS3 becomes lower than the threshold of the AND gates 57 of the signal transition accelerating driver circuits 63 to 65 at time t25, and the other signal transition accelerating driver circuits 63 to 65 make the n-channel enhancement type field effect transistors Qn21 thereof turn on. As a result, the bus status signal BS3 is rapidly decayed, and reaches the low level at time t26.

The clock signal CLK3 and the data signal Sin-0 start to rise at time t27. All the signal transition accelerating drivers 62 to 65 enter into the precharging period, and the bus line 61 is charged to the high level. The clock signal CLK3 starts to change the potential level to the low level at time t29, and all the signal transition accelerating driver circuits 62 to 65 enter into the sampling period. The signal transition accelerating driver circuit 62 responds to type field effect transistor Qn21 in the off-state from time t29 to time t31.

After time t31, the signal transition accelerating driver circuit 65 drives the bus line 41. All the signal transition accelerating driver circuits 62–65 enter into the sampling period at time t33. The signal transition accelerating driver circuit 65 responds to the data signal Sin-1 of the high level, and keeps the n-channel enhancement type field effect transistor Qn21 in the off-state. For this reason, the bus status signal BS3 is staying at the high level from time t33 to time t35.

All the signal transition accelerating driver circuits 62–65 connect the bus line 41 to the high voltage line 24 in the precharging period from time t35 to time t37. The bus line 61 has been already changed to the high level before the next sampling period, and the data signal Sin-1 was changed to the low level at time t35. All the signal transition accelerating driver circuits 62 to 65 enter into the sampling period at time t37. The signal transition accelerating driver circuit 65 changes the n-channel enhancement type field effect transistor Qn21 to the on-state at time, and the bus line 61 is discharged through the n-channel enhancement type field effect transistor Qn21 of the signal transition accelerating driver circuit 65. For this reason, the bus status signal BS3 is gently decayed from time t38 to time t39. The bus status signal BS3 exceeds the threshold of the AND gate 57 of the other signal transition accelerating driver circuits 62 to 64 at time t39, and the other signal transition accelerating driver circuits 62 to 64 participate the potential decay on the bus line 61. For this reason, the bus status signal BS3 rapidly falls from time t39 to time t40.

As will be understood from the foregoing description, the signal transition accelerating driver circuits 62–65 charge the bus line 61 in the precharging period, one of the signal transition accelerating driver circuits 62/65 drives the bus line 61 in response to the associated data signal Sin-0/Sin-1 depending upon the voltage level of the enable signals EBL4-0/EBL4-1, and the other signal transition accelerating driver circuits 65/62, 63 and 64 participate the potential decay on the bus line 61. Thus, the signal transition accelerating driver circuit with the simple circuit configuration surely achieves the job assigned through the enable signal EBL4-0/EBL4-1.

Third Embodiment

Figure 9:
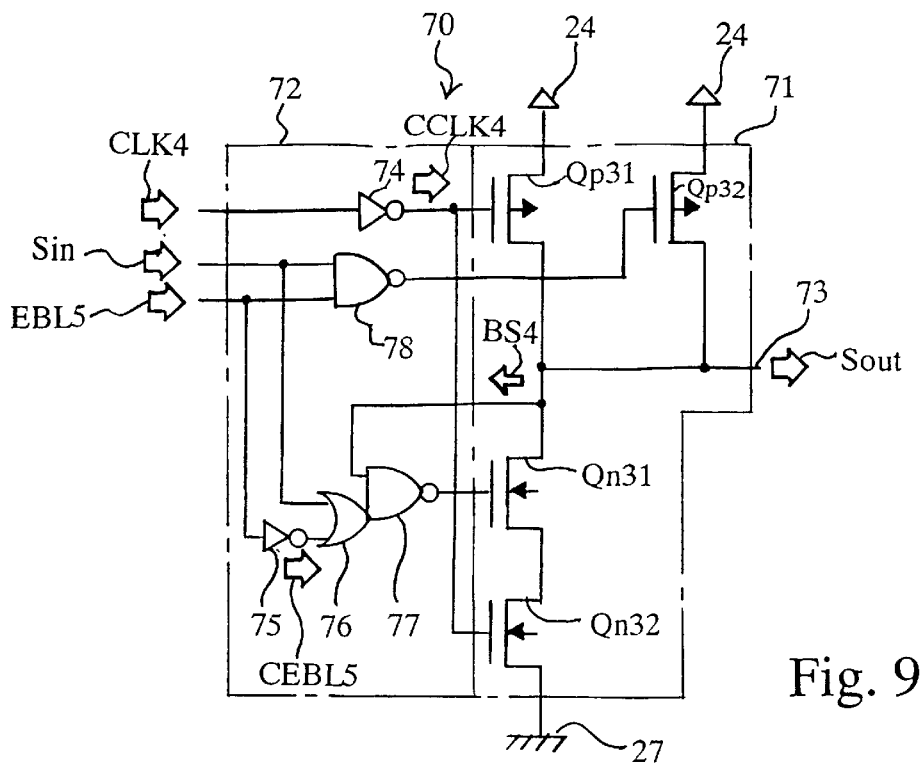
FIG. 9 is a logic diagram showing the circuit configuration of yet another signal transition accelerating driver circuit according to the present invention.

FIG. 9 illustrates yet another signal transition accelerating driver circuit 70 embodying the present invention. The signal transition accelerating driver circuit 70 also largely comprises an output driver 71 and a controller 72.

Two p-channel enhancement type field effect transistors Qp31/Qp32 are connected in parallel between the high voltage line 24 and a signal line 73, and two n-channel enhancement type field effect transistors Qn31/Qn32 are connected in series between the signal line 73 and the low voltage line 27. The p-channel enhancement type field effect transistors Qp31/Qp32 as a whole constitute the active pull-up means 23, and the series combination of the n-channel enhancement type field effect transistors Qn31/Qn32 is corresponding to the active pull-down means 26.

The controller 72 includes two inverters 74/75, an OR gate 76 and two NAND gates 77/78. A clock signal CLK4, a data signal Sin, an enable signal EBL5 and a bus status signal BS are similarly supplied to the controller 72. The clock signal CLK4 is supplied to the inverter 74, and the inverter 74 supplies an inverted signal CCLK4 of the clock signal CLK4 to the gate electrode of the p-channel enhancement type field effect transistor Qp31 and the gate electrode of the n-channel enhancement type field effect transistor Qn32. The data signal Sin and the enable signal EBL5 are supplied to the NAND gate 78, and the NAND gate 78 changes the p-channel enhancement type field effect transistor Qp32 between the on-state and the off-state.

The enable signal EBL5 is further supplied to the inverter 75, and the inverter 75 supplies an inverted signal CEBL5 of the enable signal EBL5 to one input node of the OR gate 76. The data signal Sin is supplied to the other input node of the OR gate, and the output signal of the OR gate 76 is supplied to one input node of the NAND gate 77. The bus status signal BS4 is supplied to the other input node of the NAND gate 77, and the NAND gate 77 chances the n-channel enhancement type field effect transistor Qn31 between the on-state and the off-state.

The signal transition accelerating driver circuit 70 alternately also enters into the precharging period and the sampling period. When the clock signal CLK4 is changed to the high level, the inverter 74 decays the gate potential of the p-channel enhancement type field effect transistor Qp31 and the gate potential of the n-channel enhancement type field effect transistor Qn32 with the inverted signal CCLK4. The p-channel enhancement type field effect transistor Qp31 turns on, and the n-channel enhancement type field effect transistor Qn32 turns off. The high voltage line 24 supplies electric current through the p-channel enhancement type field effect transistor Qp31 to the signal line 73. On the other hand, when the clock signal CLK4 is changed to the low level, the inverter 74 causes the p-channel enhancement type field effect transistor Qp31 to turn off and the n-channel enhancement type field effect transistor Qn32 to turn on, and the signal transition accelerating driver circuit 70 becomes responsive to the data signal Sin or the bus status signal BS4.

In the sampling period, the controller 72 behaves as follows. If the enable signal EBL5 is in the high level, the inverter 75 supplies the low level to the OR gate, and the OR gate 76 is responsive to the data signal Sin. Upon completion of the precharging, the bus status signal BS4 is in the high level, and the NAND gate 77 is enabled with the bus status signal BS4. Thus, the OR gate 76 and the NAND gate 77 supply the inverted signal of the data signal Sin to the gate electrode of the n-channel enhancement type field effect transistor Qn31, and controls the n-channel enhancement type field effect transistor Qn31.

If the enable signal EBL5 is in the low level, the inverted signal CEBL5 causes the OR gate 76 to fix the output signal thereof to the high level, and the output signal of the OR gate 76 makes the NAND gate 77 responsive to the bus status signal BS4. Thus, the n-channel enhancement type field effect transistor Qn31 is controlled with either data or bus status signal Sin/BS4 depending upon the voltage level of the enable signal EBL5.

On the other hand, the NAND gate 78 becomes responsive to the data signal Sin only when the enable signal EBL5 is in the high level. If the data signal Sin is changed to the high level, the NAND gate 78 supplies the low level to the gate electrode of the p-channel enhancement type field effect transistor Qp32, and pulls up the signal line 73 to the high level. However, if the data signal Sin is in the low level, the NAND gate 78 supplies the high level to the gate electrode of the p-channel enhancement type field effect transistor Qp32, and causes the p-channel enhancement type field effect transistor Qp32 to turn off.

Figure 10:
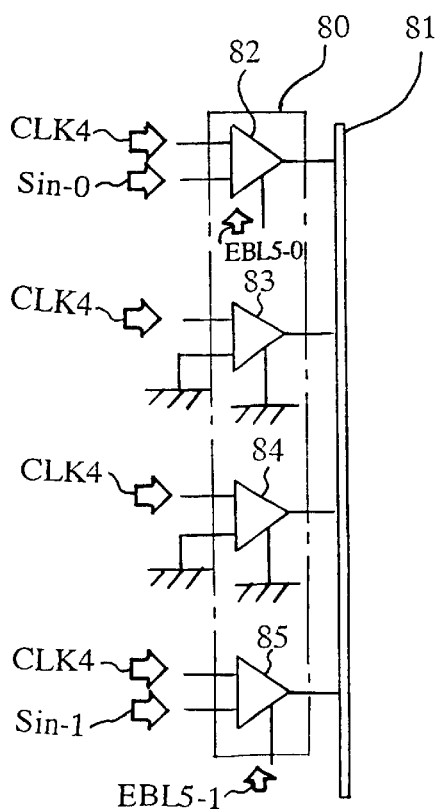
FIG. 10 is a schematic view showing yet another driving system according to the present invention.

Using the signal transition accelerating driver circuit 70, yet another bus driving system 80 is constructed as shown in FIG. 10. The bus driving system 80 is connected to a bus line 81, and includes four signal transition accelerating driver circuits 82/83/84/85. The signal transition accelerating driver circuits 82/83/84/85 have the same circuit configuration as the signal transition accelerating driver circuit 70. For this reason, the circuit components of each signal transition accelerating driver circuit 82/83/84/85 are designated by using the references designating the corresponding circuit components of the signal transition accelerating driver circuit 70.

The clock signal CLK4 is supplied to all the signal transition accelerating driver circuits 82–85. Data signals Sin-0 and Sin-1 are supplied to the NAND/OR gates 78/76 of the signal transition accelerating driver circuits 82/85, respectively, and enable signals EBL5-0 and EBL5-1 are supplied to the inverters/NAND gates 75/78 of the signal transition accelerating driver circuits 82/85, respectively. However, the other signal transition accelerating driver circuits 83/84 are supplied with the low level or logic "0" level instead of the data signal Sin and the enable signal EBL4.

Figure 11:
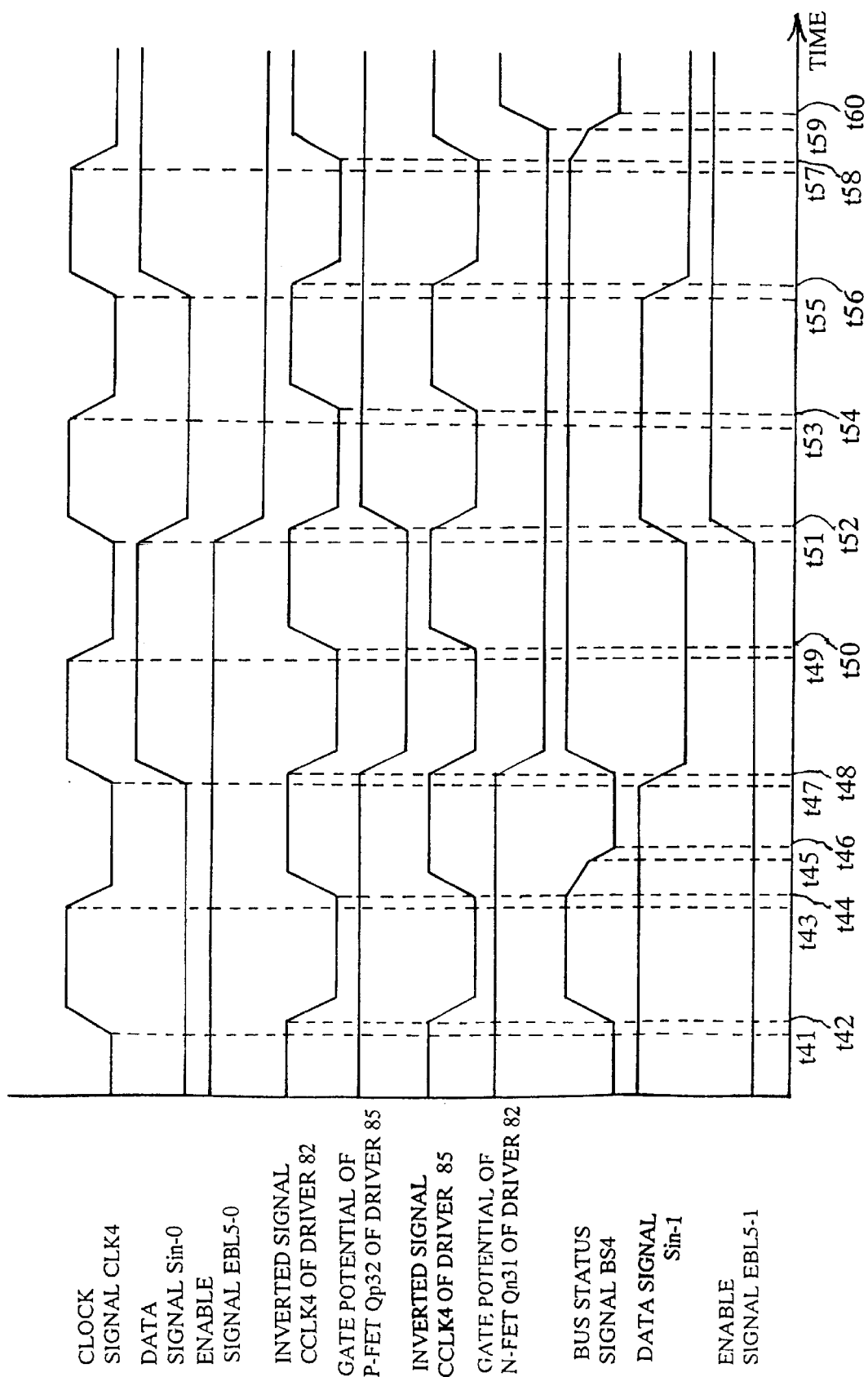
FIG. 11 is a timing chart showing the waveforms of essential signals in the driving system.

The bus driving system 80 behaves as shown in FIG. 11. The clock signal CLK4 periodically rises at time t41, t47, t51 and t55, and falls at time t43, t49, t53 and t57. As described hereinbefore, the clock signal CLK4 causes the signal transition accelerating circuits 82–85 alternately enter into the precharging period and the sampling period.

When the clock signal CLK4 is changed to the high level, the signal transition accelerating driver circuits 82 to 85 enter into the precharging period, and the inverters 74 supply th e low level to the gate electrodes of the associated p-channel enhancement type field effect transistors Qp31 and the gate electrodes of the n-channel enhancement type field effect transistors Qn32. Accordingly, the inverted signal CCLK4 goes down at time t42, t48, t52 and t56, and the rises at time t44, t50, t54 and t58. Thus, the clock signal CLK4 causes the n-channel enhancement type field effect transistors Qn32 to turn off at time t42, t48, t52 and t56, and the p-channel enhancement type field effect transistors Qp31 turn on at the same timings. When the p-channel enhancement type field effect transistors Qp31 turn on, the bus line 81 is connected through the p-channel enhancement type field effect transistors Qp31 to the high voltage line 24, and the potential level on the bus line 81 or the bus status signal BS4 goes up to the high level.

On the other hand, when the clock signal CLK4 falls down to the low level, the signal transition accelerating driver circuits 82–85 start the sampling period, and the inverters 74 change the inverted signals CCLK4 to the high level. As a result, the p-channel enhancement type field effect transistors Qp31 turn off, and the n-channel enhancement type field effect transistors Qn32 turn on. Each of the signal transition accelerating driver circuits 82/85 becomes responsive to the data signal Sin-0/Sin-1 or the bus status signal BS4 depending upon the voltage level of the associated enable signal EBL5-0/EBL5-1. However, the other signal transition accelerating driver circuits 83/84 are always responsive to the bus status signal BS4 in the sampling periods.

The enable signal EBL5-0 starts to change the potential level from the high level to the low level at time t51, and the other enable signal EBL5-1 concurrently starts to rise to the high level. Therefore, the signal transition accelerating driver circuit 82 is responsive to the associated data signal Sin-0 in the sampling periods before time t51, and the signal transition accelerating driver circuit 85 drives the bus line 81 in response to the data signal Sin-1 after time t51.

While the signal transition accelerating driver circuit 82 is driving the bus line 81, the other signal transition accelerating driver circuits 83–85 accelerate the signal transition on the bus line 81. On the contrary, while the signal transition accelerating driver circuit 85 is driving the bus line 81, the other signal transition accelerating driver circuits 82 to 84 accelerate the signal transition on the bus line 81.

In the sampling period from time t43 to time t47, the data signal Sin-0 is in the low level. Accordingly, the NAND gate 78 of the signal transition accelerating driver circuit 82 supplies the high level to the gate electrode of the p-channel enhancement type field effect transistor Qp32, and the NAND gate 77 supplies the high level to the gate electrode of the n-channel enhancement type field effect transistor Qn31. The p-channel enhancement type field effect transistor Qp32 turns off, and the n-channel enhancement type field effect transistor Qn31 turns on. As a result, electric current flows from the bus line 81 through the n-channel enhancement type field effect transistors Qn31/Qn32 to the low level line 27, and the bus status signal BS4 is gently decayed from time t44 to time t45. The bus status signal BS4 becomes lower than the threshold of the NAND gates 77 of the signal transition accelerating driver circuits 83 to 85 at time t45, and the other signal transition accelerating driver circuits 83 to 85 make the n-channel enhancement type field effect transistors Qn31 thereof turn on. As a result, the bus status signal BS4 is rapidly decayed from time t45, and reaches the low level at time t46.

The data signal Sin-0 starts to rise at time t47. The clock signal CLK4 also starts to rise at time t47, and all the signal transition accelerating drivers 82 to 85 enter into the precharging period. The bus line 81 is charged to the high level. The clock signal CLK4 starts to change the potential level to the low level at time t49, and all the signal transition accelerating driver circuits 82 to 85 enter into the sampling period. The signal transition accelerating driver circuit 82 responds to the data signal Sin-0 of the high level. Although the inverter 74 of the signal transition accelerating driver circuit 82 causes the p-channel enhancement type field effect transistor Qp31 to turn off at time t50, the NAND gate 78 changes the p-channel enhancement type field effect transistor Qp32 to the on-state, and the NAND gate 77 keeps the n-channel enhancement type field effect transistor Qn31 in the off-state. As a result, the bus status signal BS4 rises to the high level from time t50.

After time t51, the signal transition accelerating driver circuit 85 drives the bus line 81. After the precharging period from time t51 to time t53, all the signal transition accelerating driver circuits 82–85 enter into the sampling period. The signal transition accelerating driver circuit 85 responds to the data signal Sin-1 of the high level, and keeps the p-channel enhancement type field effect transistor Qp32 and the n-channel enhancement type field effect transistor Qn31 in the on-state and the off-state, respectively. For this reason, the bus status signal BS4 is staying at the high level from time t53 to time t55.

All the signal transition accelerating driver circuits 82–85 connect the bus line 81 to the high voltage line 24 in the precharging period from time t55 to time t57. The bus line 81 has been already changed to the high level before the sampling period, and the data signal Sin-1 was changed to the low level at time t55. All the signal transition accelerating driver circuits 82 to 85 enter into the sampling period at time t57. The signal transition accelerating driver circuit 85 changes the p-channel enhancement type field effect transistor Qp32 and the n-channel enhancement type field effect transistor Qn31 to the off-state and the on-state at time t58, and the bus line 81 is discharged through the n-channel enhancement type field effect transistor Qn31 of the signal transition accelerating driver circuit 85, only. For this reason, the bus status signal BS4 is gently decayed from time t58 to time t59. The bus status signal BS4 becomes lower than the threshold of the NAND gates 77 of the other signal transition accelerating driver circuits 82 to 84 at time t59, and the other signal transition accelerating driver circuits 82 to 84 participate the potential decay on the bus line 81. For this reason, the bus status signal BS4 rapidly falls from time t59 to time t60.

As will be understood from the foregoing description, the signal transition accelerating driver circuits 82–85 charge the bus line 81 in the precharging period, one of the signal transition accelerating driver circuits 82/85 drives the bus line 81 in response to the associated data signal Sin-0/Sin-1 depending upon the voltage level of the enable signals EBL5-0/EBL5-1, and the other signal transition accelerating driver circuits 85/82, 83 and 84 participate the potential decay on the bus line 81. Thus, the signal transition accelerating driver circuit with the simple circuit configuration surely achieves the job assigned through the enable signal EBL5-0/EBL5-1.

The p-channel enhancement type field effect transistor Qp32 is turned on in the sampling period in the presence of the data signal Sin of the high level, and the bus line 81 is pulled up. This feature is desirable, because the p-channel enhancement type field effect transistor Qp32 prevents the bus line 81 from noise.

Fourth Embodiment

Figure 12:
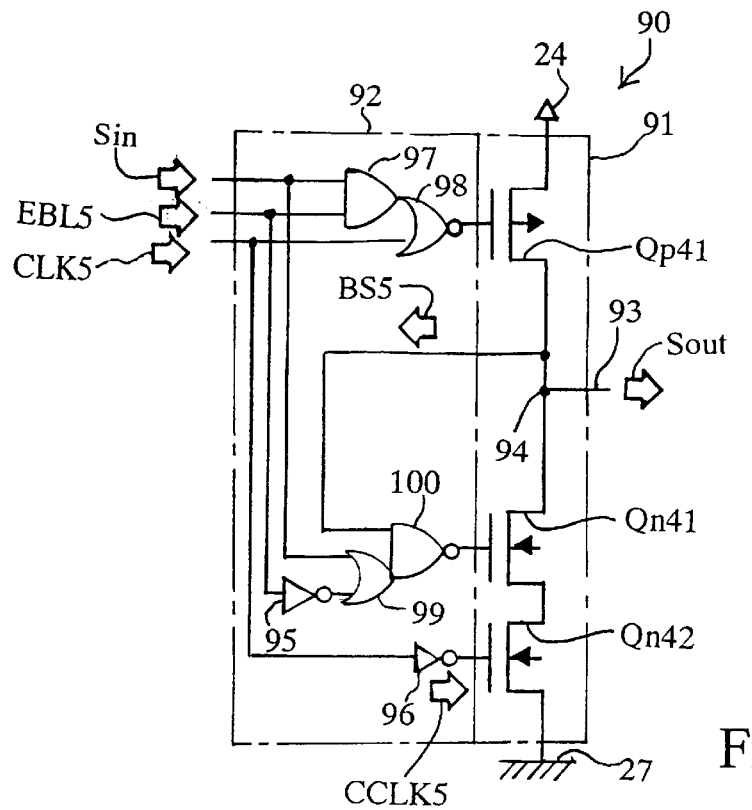
FIG. 12 is a logic diagram showing the circuit configuration of still another signal transition accelerating driver circuit according to the present invention.

Turning to FIG. 12 of the drawings, still another signal transition accelerating driver circuit embodying the present invention largely comprises an output driver 91 and a controller 92. The output driver 91 is implemented by a series combination of a p-channel enhancement type field effect transistor Qp41 and n-channel enhancement type field effect transistors Qn41/Qn42, and the series combination is connected between the high voltage line 24 and the low voltage line 27. A signal line 93 to be driven is connected between the common drain node 94 between the p-channel enhancement type field effect transistor Qp41 and the n-channel enhancement type field effect transistor Qn41. The p-channel enhancement type field effect transistor Qp41 serves as the active pull-up means 23, and the n-channel enhancement type field effect transistors Qn41/Qn42 are corresponding to the active pull-down means 26.

The controller 92 includes inverters 95/96, an AND gate 97, a NOR gate 98, an OR gate 99 and an NAND gate 100. The clock signal CLK5 is supplied to the inverter 96 and the NOR gate 98. When the clock signal CLK5 is changed to the high level, the NOR gate 98 supplies the low level to the gate electrode of the p-channel enhancement type field effect transistor Qp41, and the high voltage line 24 is connected through the p-channel enhancement type field effect transistor Qp41 to the signal line 93. The inverter 96 causes the n-channel enhancement type field effect transistor Qn42 to turn off with the inverted signal CCLK5 of the low level, and the n-channel enhancement type field effect transistor Qn42 electrically isolates the signal line 93 from the low voltage line 27. Thus, while the clock signal CLK5 is staying in the high level, the signal line 93 is charged to the high level.

When the clock signal CLK5 is changed to the low level, the inverter 96 causes the n-channel enhancement type field effect transistor Qn42 to turn off, and the signal line 93 is connectable to the low level line 27. Then, the signal transition accelerating driver circuit 90 enters into the sampling period. In the sampling period, the controller 92 is responsive to the data signal Sin or the bus status signal BS5 depending upon the voltage level of the enable signal EBL5. The enable signal EBL5 is assumed to be in the low level. The AND gate 97 fixes the output node thereof to the low level regardless of the data signal Sin, and the AND gate 97 and the clock signal CLK5 of the low level cause the p-channel enhancement type field effect transistor Qp41 to turn off. Thus, the signal line 93 is isolated from the high voltage line 24. On the other hand, the inverter 95 supplies the inverted signal CEBL5 of the high level to the OR gate 99, and the OR gate 99 fixes the output node thereof to the high level. The NAND gate 100 is enabled with the high level at the output node of the OR gate 99, and controls the gate potential of the n-channel enhancement type field effect transistor Qn41 depending upon the bus status signal BS5. Thus, while the enable signal EBL5 is staying in the low level, the signal transition accelerating driver circuit 90 accelerates the potential change on the signal line 93.

When the enable signal EBL5 is changed to the high level, the OR gate 99 becomes responsive to the data signal Sin, and the bus status signal BS5 of the high level makes the NAND gate 100 responsive to the voltage level at the output node of the OR gate 99. The NOR gate 98 is still responsive to the voltage level at the output node of the AND gate 97, and the enable signal EBL5 of the high level makes the AND gate 97 responsive to the data signal Sin. Thus, not only the p-channel enhancement type field effect transistor Qp41 but also the n-channel enhancement type field effect transistor Qn41 are controlled by the controller 92.

If the data signal Sin is in the high level, the AND gate 97 yields the high level at the output node thereof, and the OR gate 99 produces the high level at the output node thereof. The AND gate 97 causes the NOR gate 98 to supply the low level to the gate electrode of the p-channel enhancement type field effect transistor Qp41, and the p-channel enhancement type field effect transistor Qp41 connects the high voltage line 24 to the signal line. On the other hand, the OR gate 99 causes the NAND gate 100 to supply the low level to the gate electrode of the n-channel enhancement type field effect transistor Qn41, and the n-channel enhancement type field effect transistor Qn41 isolates the signal line 93 from the low voltage line 27.

If the data signal Sin is in the low level, the AND gate 97 yields the low level at the output node thereof, and the OR gate 99 produces the low level at the output node thereof The AND gate 97 causes the NOR gate 98 to supply the high level to the gate electrode of the p-channel enhancement type field effect transistor Qp41, and the p-channel enhancement type field effect transistor Qp41 isolates the signal line 93 from the high voltage line 24. On the other hand, the OR gate 99 causes the NAND gate 100 to supply the high level to the n-channel enhancement type field effect transistor Qn41, and the n-channel enhancement type field effect transistor Qn41 connects the signal line 93 to the low voltage line 27. Thus, the signal transition accelerating driver circuit 90 changes the signal line 93 to the low level in response to the data signal Sin.

As will be understood from the foregoing description, the signal transition accelerating driver circuit 90 behaves as similar to the signal transition accelerating driver circuit 70. However, the output circuit 91 is simpler than that of the third embodiment.

Fifth Embodiment

Figure 13:
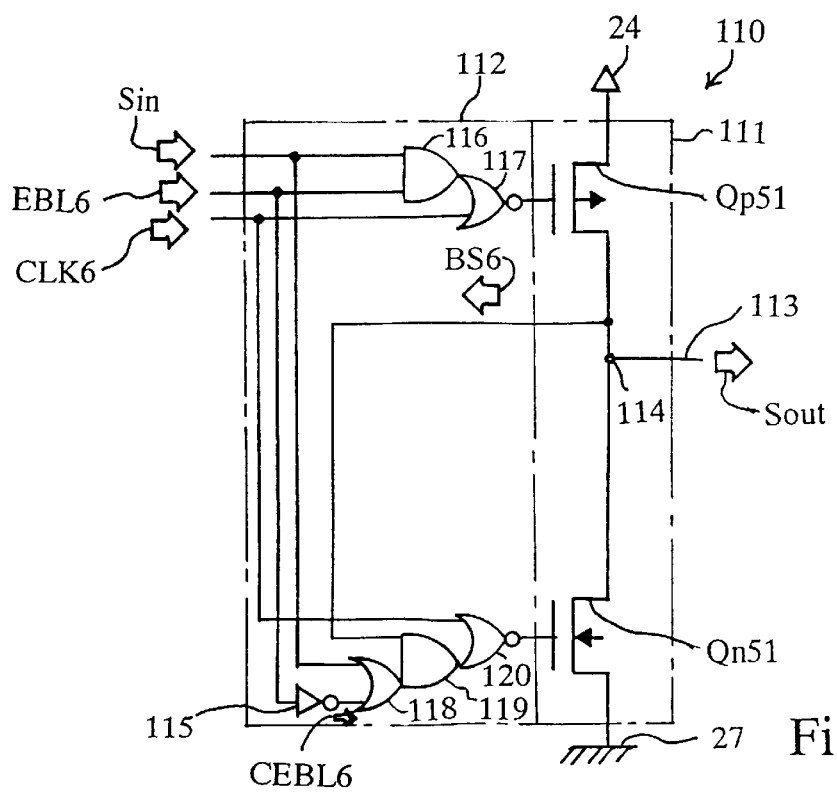
FIG. 13 is a logic diagram showing the circuit configuration of still another signal transition accelerating driver circuit according to the present invention.

Turning to FIG. 13 of the drawings, another signal transition accelerating driver circuit embodying the present invention largely comprises an output driver 111 and a controller 112. The output driver 111 is implemented by a series combination of a p-channel enhancement type field effect transistor Qp51 and an n-channel enhancement type field effect transistor Qn51, and the series combination is connected between the high voltage line 24 and the low voltage line 27. A signal line 113 to be driven is connected between the common drain node 114 between the p-channel enhancement type field effect transistor Qp51 and the n-channel enhancement type field effect transistor Qn51. The p-channel enhancement type field effect transistor Qp51 is corresponding to the active pull-up means 23, and the n-channel enhancement type field effect transistor Qn51 serves as the active pull-down means 26.

The controller 112 includes an inverter 115, an AND gate 116, a NOR gate 117, an OR gate 118, an AND gate 119 and a NAND gate 120. The clock signal CLK6 is supplied to the NOR gates 117/120. When the clock signal CLK6 is changed to the high level, the NOR gates 117/120 supplies the low level to the gate electrode of the p-channel enhancement type field effect transistor Qp51 and the gate electrode of the n-channel enhancement type field effect transistor Qn51, and the high voltage line 24 is connected through the p-channel enhancement type field effect transistor Qp51 to the signal line 113. The p-channel enhancement type field effect transistor Qp51 turns on, and the n-channel enhancement type field effect transistor Qn51 turns off. Thus, while the clock signal CLK5 is staying in the high level, the signal line 93 is charged to the high level.

When the clock signal CLK5 is changed to the low level, the NOR gates 117/120 become responsive to the output nodes of the AND gates 116/119, and the signal transition accelerating driver circuit 110 enters into the sampling period.

In the sampling period, the controller 112 is responsive to the data signal Sin or the bus status signal BS6 depending upon the voltage level of the enable signal EBL6. The enable signal EBL6 is assumed to be in the low level. The AND gate 116 fixes the output node thereof to the low level regardless of the data signal Sin, and the AND gate 116 and the clock signal CLK6 of the low level cause the p-channel enhancement type field effect transistor Qp51 to turn off. Thus, the signal line 113 is isolated from the high voltage line 24. On the other hand, the inverter 115 supplies the inverted signal CEBL6 of the high level to the OR gate 118, and the OR gate 118 fixes the output node thereof to the high level. The AND gate 119 is enabled with the high level at the output node of the OR gate 118. When the bus status signal BS6 becomes lower than the threshold of the AND gate 119, the AND gate 119 changes the output node thereof from the high level to the low level, and, accordingly, the NOR gate 120 changes the gate electrode of the n-channel enhancement type field effect transistor Qn51 from the low level to the high level. As a result, the n-channel enhancement type field effect transistor Qn51 turns on, and the signal transition accelerating driver circuit 110 accelerates the potential decay on the signal line 113.

When the enable signal EBL6 is changed to the high level, the AND gate 116 becomes responsive to the data signal Sin, and the inverter 115 makes the OR gate 118 responsive to the data signal Sin. The bus status signal BS6 of the high level makes the AND gate 119 responsive to the voltage level at the output node of the OR gate 118. The NOR gate 117 is still responsive to the voltage level at the output node of the AND gate 116, and the enable signal EBL6 of the high level makes the AND gate 116 responsive to the data signal Sin. Thus, not only the p-channel enhancement type field effect transistor Qp51 but also the n-channel enhancement type field effect transistor Qn51 are controlled with the data signal Sin.

If the data signal Sin is in the high level, the AND gate 116 yields the high level at the output node thereof, and the NOR gate 117 produces the low level at the output node thereof. The NOR gate 117 supplies the low level to the gate electrode of the p-channel enhancement type field effect transistor Qp51, and the p-channel enhancement type field effect transistor Qp51 connects the high voltage line 24 to the signal line 113. On the other hand, the OR gate 118 causes the AND gate 119 to yield the high level at the output node thereof, and AND gate 119 causes the NOR gate 120 to supply the low level to the gate electrode of the n-channel enhancement type field effect transistor Qn51. As a result, the n-channel enhancement type field effect transistor Qn51 isolates the signal line 113 from the low voltage line 27. Thus, the signal transition accelerating driver circuit 110 changes the signal line 113 to the high level.

If the data signal Sin is in the low level, the AND gate 116 yields the low level at the output node thereof, and the OR gate 118 produces the low level at the output node thereof. The AND gate 116 causes the NOR gate 117 to supply the high level to the gate electrode of the p-channel enhancement type field effect transistor Qp51, and the p-channel enhancement type field effect transistor Qp51 isolates the signal line 113 from the high voltage line 24. On the other hand, the OR gate 118 causes the AND gate 118 to supply the low level to the NOR gate 120, and the NOR gate 120 supplies the high level to the gate electrode of the n-channel enhancement type field effect transistor Qn51. As a result, the n-channel enhancement type field effect transistor Qn51 connects the signal line 113 to the low voltage line 27. Thus, the signal transition accelerating driver circuit 110 changes the signal line 113 to the low level in response to the data signal Sin.

As will be understood from the foregoing description, the signal transition accelerating driver circuit 110 behaves as similar to the signal transition accelerating driver circuit 90. However, the output circuit 111 is simpler than that of the fourth embodiment.

The embodiments described hereinbefore are of a dynamic type. The signal line is charged to the high level in the precharging period, and is driven depending upon the data signal. While the enable signal is in the low level, the potential decay is accelerated. Thus, the signal line is only changed from the high level to the low level in the sampling period, and the circuit configuration is simple. The n-channel enhancement type field effect transistor discharges the electric current from the signal line, and is larger in current driving capability than a p-channel enhancement type field effect transistor. For this reason, the potential decay is accelerated.

Sixth Embodiment

Figure 14:
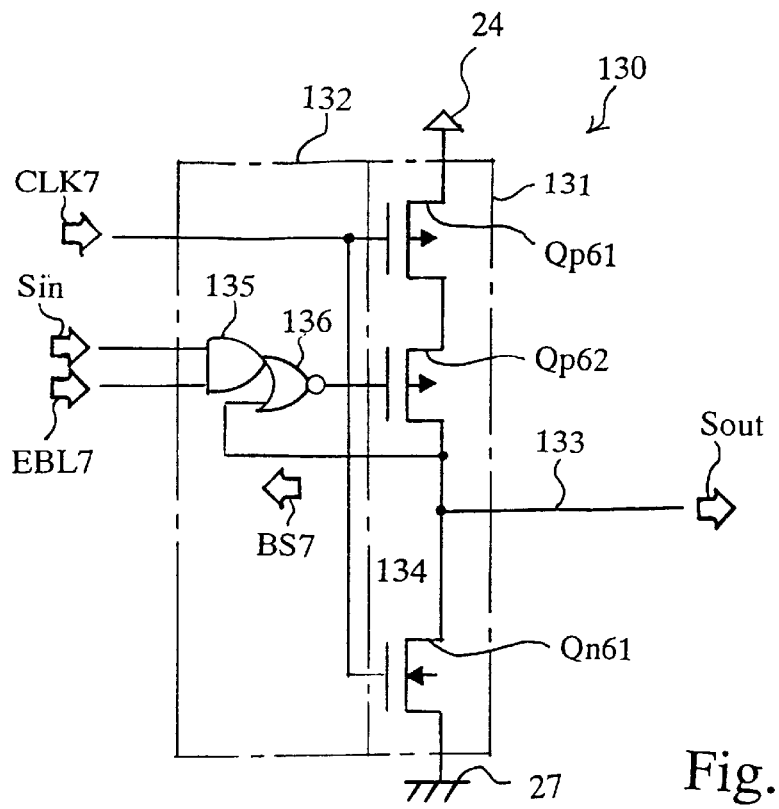
FIG. 14 is a logic diagram showing the circuit configuration of still another signal transition accelerating driver circuit according to the present invention.

Turning to FIG. 14, another signal transition accelerating driver circuit 130 embodying the present invention largely comprises an output circuit 131 and a controller 132. The output driver 131 is implemented by a series combination of p-channel enhancement type field effect transistors Qp61/Qp62 and an n-channel enhancement type field effect transistor Qn61. The series combination is connected between the high voltage line 24 and the low voltage line 27. A signal line 133 is connected to the common drain node 134 between the p-channel enhancement type field effect transistor Qp62 and the n-channel enhancement type field effect transistor Qn61. The p-channel enhancement type field effect transistors Qp61/Qp62 are corresponding to the active pull-up means 23, and the n-channel enhancement type field effect transistor Qn61 serves as the active pull-down means 26.

The controller 132 includes an AND gate 135 and a NOR gate 136, and transfers a clock signal CLK7 to the gate electrode of the p-channel enhancement type field effect transistor Qp61 and the gate electrode of the n-channel enhancement type field effect transistor Qn61. When the clock signal CLK7 is chanced to the high level, the p-channel enhancement type field effect transistor Qp61 turns off, and the n-channel enhancement type field effect transistor Qn61 turns on. As a result, the signal line 133 is discharged to the low voltage line 133, and the preliminary level is corresponding to the low level in this instance.

When the clock signal CLK7 is changed to the low level, the n-channel enhancement type field effect transistor Qn61 turns off, and the p-channel enhancement type field effect transistor Qp61 turns on. Thus, the signal line 133 is connectable to the high voltage line 24 in the sampling period.

The data signal Sin and the enable signal EBL7 are supplied to the AND gate 135, and the output signal of the AND gate 135 and the bus status signal BS7 are supplied to the NOR gate 136. While the enable signal EBL7 is staying in the low level, both input nodes of the NOR gate 136 are firstly in the low level, and the NOR gate 136 supplies the high level to the gate electrode of the p-channel enhancement type field effect transistor Qp62. The p-channel enhancement type field effect transistor Qp62 is turned off. However, the signal line 133 rises toward the high level. When the signal line 133 exceeds the threshold of the NOR gate 136, the NOR gate 136 chances the output node thereof to the low level, and the p-channel enhancement type field effect transistor Qp62 turns on. As a result, electric current flows from the high voltage line 24 through the p-channel enhancement type field effect transistors Qp61/Qp62 to the signal line 133, and the signal transition accelerating driver circuit 130 accelerates the potential rise on the signal line 133.

When the enable signal EBL7 is changed to the high level, the AND gate 135 becomes responsive to the data signal Sin. If the data signal is in the high level, the AND gate 135 yields the high level at the output node thereof, and causes the NOR gate 136 to supply the low level to the gate electrode of the p-channel enhancement type field effect transistor Qp62. As a result, the signal line 133 is charged to the high level. On the other hand, if the data signal Sin is in the low level, the AND gate 135 produces the low level at the output node thereof, and causes the NOR gate 136 to supply the high level to the gate electrode of the p-channel enhancement type field effect transistor Qp62. The p-channel enhancement type field effect transistor Qp62 turns off, and the signal line 133 is maintained at the low level.

Figure 15:
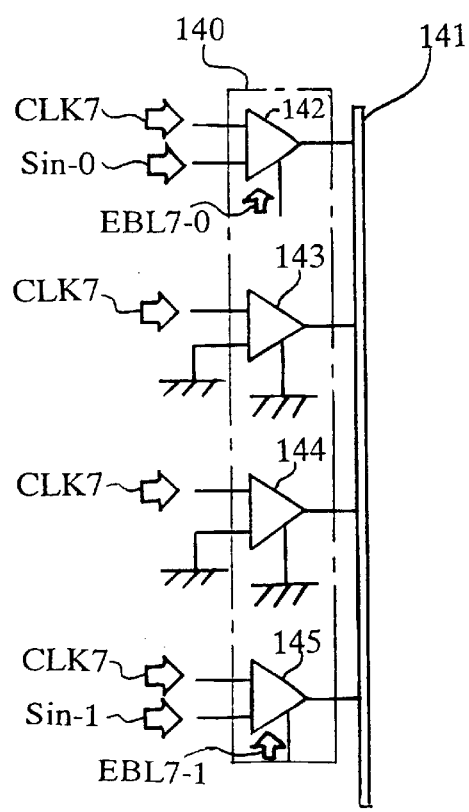
FIG. 15 is a schematic view showing still another driving system according to the present invention.

Using the signal transition accelerating driver circuit 130, a bus driving system 140 is constructed as shown in FIG. 15. The bus driving system 140 is connected to a bus line 141, and includes four signal transition accelerating driver circuits 142/143/144/145. The signal transition accelerating driver circuits 142/143/144/145 have the same circuit configuration as the signal transition accelerating driver circuit 130. For this reason, the circuit components of each signal transition accelerating driver circuit 142/143/144/145 are designated by using the same references designating the corresponding circuit components of the signal transition accelerating driver circuit 130.

The clock signal CLK7 is supplied to all the signal transition accelerating driver circuits 142–145. Data signals Sin-0 and Sin-1 are supplied to the AND gates 135 of the signal transition accelerating driver circuits 142/145, respectively, and enable signals EBL7-0 and EBL7-1 are further supplied to the AND gates 135 of the signal transition accelerating driver circuits 142/145, respectively. However, the other signal transition accelerating driver circuits 143/144 are supplied with the low level or logic "0" level instead of the data signal Sin and the enable signal EBL7.

Figure 16:
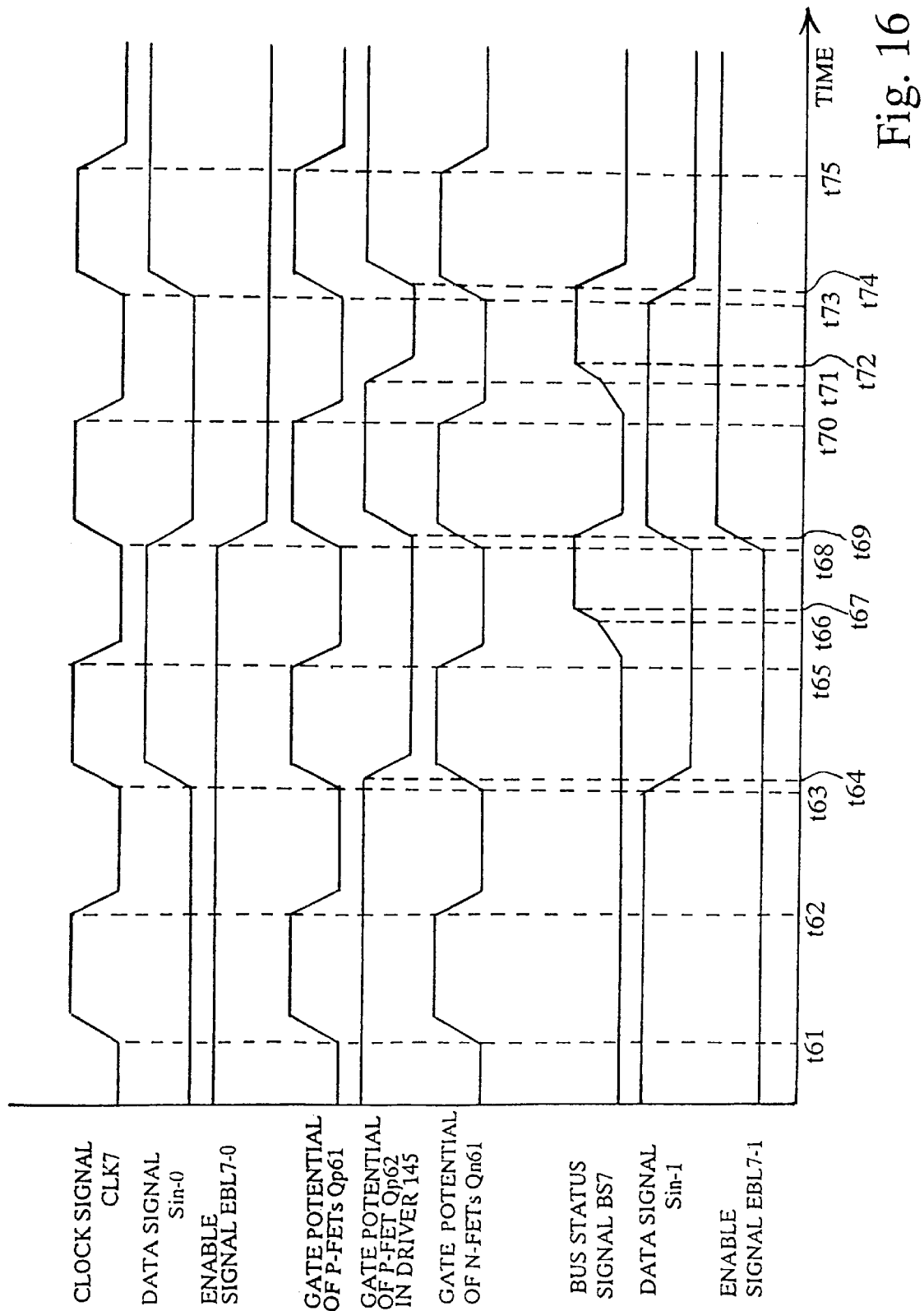
FIG. 16 is a timing chart showing the waveforms of essential signals in the driving system.
Figure 17:
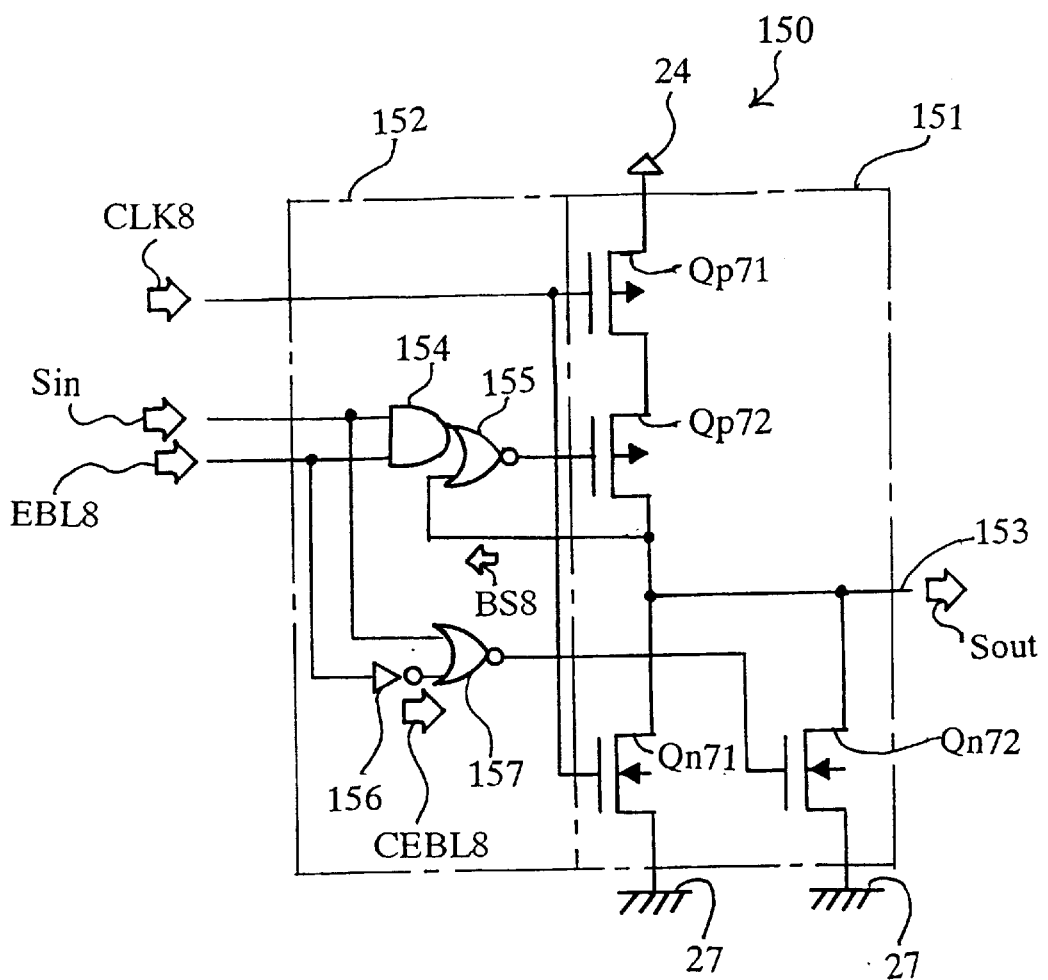
FIG. 17 is a logic diagram showing the circuit configuration of still another signal transition accelerating driver circuit according to the present invention.

The bus driving system 140 behaves as shown in FIG. 16. The clock signal CLK7 periodically rises at time t61, t63, t68 and t73, and falls at time t62, t65, t70 and t75. As described hereinbefore, the clock signal CLK7 causes the signal transition accelerating circuits 142–145 alternately enter into a predischarging period and a sampling period.

When the clock signal CLK7 is changed to the high level, the signal transition accelerating driver circuits 142 to 145 enter into the predischarging period, and the high level is supplied to the gate electrodes of the associated n-channel enhancement type field effect transistors Qn61 and the gate electrodes of the p-channel enhancement type field effect transistors Qp61. Accordingly, the gate potentials of the p-channel enhancement type field effect transistors Qp61 and the gate potentials of the n-channel enhancement type field effect transistors Qp61 go up to the high level at time t61, t63, t68 and t73, and the bus line 61 is connected through the n-channel enhancement type field effect transistors Qn61 to the low voltage line 27. As a result, the potential level on the bus line 141 or the bus status signal BS7 is in the low level.

When the clock signal CLK7 falls down to the low level, the signal transition accelerating driver circuits 142–145 start the sampling period, and the gate potentials of the p-channel/n-channel enhancement type field effect transistors Qp61/Qn61 go down to the low level. The p-channel enhancement type field effect transistors Qp61 turn on, and the n-channel enhancement type field effect transistors Qn61 turn off. Thus, the bus line 141 is connectable to the high voltage line 24 in the sampling period. Each of the signal transition accelerating driver circuits 142/145 becomes responsive to the data signal Sin-0/Sin-1 or the bus status signal BS7 depending upon the voltage level of the associated enable signal EBL7-0/EBL7-1. However, the other signal transition accelerating driver circuits 143/144 are always responsive to the bus status signal BS7 in the sampling periods.

The enable signal EBL7-0 starts to change the potential level from the high level to the low level at time t68, and the other enable signal EBL7-1 concurrently starts to rise to the high level. Therefore, the signal transition accelerating driver circuit 142 is responsive to the associated data signal Sin-0 in the sampling periods before time t68, and the signal transition accelerating driver circuit 145 drives the bus line 141 in response to the data signal Sin-1 after time t68.

While the signal transition accelerating driver circuit 142 is driving the bus line 141, the other signal transition accelerating driver circuits 143–145 accelerate the signal transition on the bus line 141. On the contrary, while the signal transition accelerating driver circuit 145 is driving the bus line 141, the other signal transition accelerating driver circuits 142 to 144 accelerate the signal transition on the bus line 141.

In the sampling period from time t62 to time t63, the data signal Sin-0 is in the low level, and the signal transition accelerating driver circuit 142 makes the p-channel enhancement type field effect transistor Qp62 thereof turn off. Accordingly, the potential level on the bus line 141 is maintained in the low level.

The clock signal CLK7 and the data signal Sin-0 start to rise at time t63. All the signal transition accelerating drivers 142 to 145 enter into the predischarging period, and the bus line 141 is connected to the low voltage line 27. The clock signal CLK7 starts to change the potential level to the low level at time t65, and all the signal transition accelerating driver circuits 142 to 145 enter into the sampling period. The signal transition accelerating driver circuit 142 responds to the data signal Sin-0 of the high level, and makes the p-channel enhancement type field effect transistor Qp62 turn on. Then, electric current flows from the high voltage line 24 to the signal line 133, and gradually raises the potential level on the bus line 141. For this reason, the bus status signal BS7 starts to gradually rise. The bus status signal BS7 exceeds the threshold of the NOR gates 136 of the signal transition accelerating driver circuits 143 to 145 at time t66, and the NOR gates 136 change the gate potential of the associated p-channel enhancement type field effect transistors Qp62. Then, the p-channel enhancement type field effect transistors Qp62 turn on, and supply electric current to the bus line 133. For this reason, the bus status signal BS7 rapidly rises the potential at time t66, and reaches the high level at time t67.

After time t68, the signal transition accelerating driver circuit 145 drives the bus line 141. All the signal transition accelerating driver circuits 142–145 enter into the predischarging period at time t68, and the n-channel enhancement type field effect transistors Qn61 turn on at time t68. The bus line 141 is discharged to the low level.

The signal transition accelerating driver circuits 142 to 145 enter into the sampling period at time t70. The signal transition accelerating driver circuit 145 responds to the data signal Sin-1 of the high level, and changes the p-channel enhancement type field effect transistor Qp62 to the on-state. For this reason, the bus status signal BS7 gradually rises toward the high level. The bus status signal exceeds the threshold of the NOR gates 136 of the other signal transition accelerating driver circuits 142 to 144, and the NOR gates 136 cause the p-channel enhancement type field effect transistors Qp62 to turn on. For this reason, the bus status signal BS7 rapidly raises the potential level at time t71, and reaches the high level at time t72.

All the signal transition accelerating driver circuits 142–145 connect the bus line 141 to the low voltage line 24 in the predischarging period from time t73 to time t75, and the bus status signal BS7 starts to change the potential level to the low level at time t74. The data signal Sin-1 was changed to the low level at time t73.

All the signal transition accelerating driver circuits 142 to 146 enter into the sampling period at time t75. The signal transition accelerating driver circuit 145 keeps the p-channel enhancement type field effect transistor Qp62 in the off-state, and the bus line 141 is staying in the low level.

As will be understood from the foregoing description, the signal transition accelerating driver circuits 142–145 discharge the bus line 141 in the predischarging, period, one of the signal transition accelerating driver circuits 142/145 drives the bus line 141 in response to the associated data signal Sin-0/Sin-1 depending upon the voltage level of the enable signals EBL4-0/EBL4-1; and the other signal transition accelerating driver circuits 145/142, 143 and 144 participate the potential rise on the bus line 141. Thus, the signal transition accelerating driver circuit with the simple circuit configuration surely achieves the job assigned through the enable signal EBL7-0/EBL7-1.

Seventh Embodiment

FIG. 18 illustrates another signal transition accelerating driver circuit 150 embodying the present invention. The signal transition accelerating driver circuit 150 largely comprises an output driver 151 and a controller 152. The output driver 151 includes a series combination of p-channel enhancement type field effect transistors Qp71/Qp72 connected between the high voltage line 24 and a signal line 153 and a parallel combination of n-channel enhancement type field effect transistors Qn71/Qn72 connected between the signal line 153 and the low voltage line 27. The series combination of p-channel enhancement type field effect transistors Qp71/Qp72 is corresponding to the active pull-up means 23, and the parallel combination of n-channel enhancement type field effect transistors Qn71/Qn72 serves as the active pull-down means 26.

The controller 152 includes an AND gate 154, a NOR gate 155, an inverter 156 and a NOR gate 157. A clock signal CLK8 is supplied to the gate electrode of the p-channel enhancement type field effect transistor Qp71 and the gate electrode of the n-channel enhancement type field effect transistor Qn72. While the clock signal CLK8 is in the high level, the p-channel enhancement type field effect transistor Qp71 is turned off, and the n-channel enhancement type field effect transistor Qn72 is turned on. Thus, the signal line 153 is connected through the n-channel enhancement type field effect transistor Qn72 to the low voltage line 27 in the predischarging period.

When the clock signal CLK8 is changed to the low level, the p-channel enhancement type field effect transistor Qp71 turns on, and the n-channel enhancement type field effect transistor Qn72 turns off. The signal line 153 is electrically isolated from the low voltage line 27, and is connectable to the high voltage line 24. Thus, the signal transition accelerating driver circuit 150 is responsive to the data signal Sin or the bus status signal BS8 depending upon the voltage level of the enable signal EBL8 in the sampling period.

The data signal Sin is supplied to the AND gate 154 and the NOR gate 157, and the enable signal EBL8 is supplied to the AND gate 154 and the inverter 156. The inverter 156 supplies an inverted signal CEBL8 of the enable signal EBL8 to the NOR gate 157.

In the sampling period, the controller 152 behaves as follows. If the enable signal EBL8 is in the high level, the AND gate 154 is responsive to the data signal Sin, and the inverted signal CEBL8 of the low level makes the NOR gate 157 also responsive to the data signal Sin. The low level on the signal line 153 makes the NOR gate 155 responsive to the potential level at the output node of the AND gate 154.

When the data signal Sin is changed to the high level, the NOR gate 155 supplies the low level to the gate electrode of the p-channel enhancement type field effect transistor Qp72, and the other NOR gate 157 supplies the low level to the gate electrode of the n-channel enhancement type field effect transistor Qn72. The p-channel enhancement type field effect transistor Qp72 turns on, and the n-channel enhancement type field effect transistor Qn72 turns off. As a result, electric current flows from the high voltage line 24 through the p-channel enhancement type field effect transistors Qp71/Qp72 to the signal line 153, and raises the potential level on the signal line 153.

When the data signal Sin is changed to the low level, the NOR gate 155 supplies the high level to the gate electrode of the p-channel enhancement type field effect transistor Qp72, and the other NOR gate 157 supplies the high level to the gate electrode of the n-channel enhancement type field effect transistor Qn72. The p-channel enhancement type field effect transistor Qp72 turns off, and the n-channel enhancement type field effect transistor Qn72 turns on. The n-channel enhancement type field effect transistor Qn72 discharges the signal line 153.

On the contrary, if the enable signal EBL8 is in the low level, the AND gate 154 fixes the potential level at the output node thereof to the low level, and the inverted signal CEBL8 causes the NOR gate 157 to fix the potential level at the output node thereof to the low level. The low level is supplied form the NOR gate 157 to the gate electrode of the n-channel enhancement type field effect transistor Qp72, and the n-channel enhancement type field effect transistor Qn72 turns off. The AND gate 154 makes the NOR gate 155 responsive to the bus status signal BS8. The bus status signal BS8 is in the low level, the NOR gate 155 supplies the high level to the gate electrode of the p-channel enhancement type field effect transistor Qp72, and the p-channel enhancement type field effect transistor Qp72 is turned off. When the bus status signal BS8 exceeds the threshold of the NOR gate 155, the NOR gate 155 changes the output node thereof to the low level, and the p-channel enhancement type field effect transistor Qp72 turns on. The electric current flows through the p-channel enhancement type field effect transistors Qp71/Qp72 to the signal line 153, and accelerates the potential rise of the bus status signal BS8.

As will be appreciated from the foregoing description, the signal transition accelerating driver circuit according to the present invention firstly gives a preliminary level, i.e., the high level or the low level, to the signal line, and, thereafter, responds to the data signal or the bus status signal depending upon the voltage level of the enable signal. Thus, the signal transition accelerating driver circuit according to the present invention drives the signal line and accelerates the signal transition on the signal line. Any gate circuit is required, and the circuit configuration is simpler than that of the prior art signal transition accelerating bus driver.

Although particular embodiments of the present invention have been shown and described, it will be apparent to those skilled in the art that various changes and modifications may be made without departing from the spirit and scope of the present invention. The logic gates of the controller are never limited to those of each embodiment. For example, an inverter may be replaced with a NOR gate or a NAND gate.

What is claimed is:

1. A signal transition accelerating driver circuit comprising:

an output driver connected between two sources having respective first and second potential levels different from each other, and a signal line to be driven, and having a first phase of operation for giving a preliminary level to said signal line in response to a first control signal and a second phase of operation for fixing said signal line to one of said first and second potential levels in response to a second control signal; and a controller changing said first control signal between said first potential level indicative of said first phase of operation and said second potential level indicative of said second phase of operation, and responsive to a third control signal of a third potential level for producing said second control signal on the basis of a data signal and to said third control signal of a fourth potential level for producing said second control signal on the basis of a fifth potential level on said signal line, wherein a clock signal is provided to said controller, and wherein said controller provides said first control signal at one of said first potential level and said second potential level, based on a potential level of said clock signal.

2. The signal transition accelerating driver circuit as set forth in claim 1, in which said output driver includes an active pull-up means connected between said signal line and one of said two sources supplying a high voltage as said first potential level and an active pull-down means connected between said signal line and the other of said two sources supplying a low voltage as said second potential level, and said active pull-up means and said active pull-down means are selectively responsive to said first and second control signals for connecting said signal line to said other of said two sources.

3. The signal transition accelerating driver circuit as set forth in claim 2, in which said active pull-up means is responsive to said first control signal for supplying said high voltage to said signal line as said preliminary level.

4. A signal transition accelerating driver circuit comprising:

an output driver connected between two sources having respective first and second potential levels different from each other, and a signal line to be driven, and having a first phase of operation for giving a preliminary level to said signal line in response to a first control signal and a second phase of operation for fixing said signal line to one of said first and second potential levels in response to a second control signal; and a controller changing said first control signal between a first level indicative of said first phase of operation and a second level indicative of said second phase of operation, and responsive to a third control signal of a third potential level for producing said second control signal on the basis of a data signal and to said third control signal of a fourth potential level for producing said second control signal on the basis of a fifth potential level on said signal line, wherein said output driver includes an active pull-up means connected between said signal line and one of said two sources supplying a high voltage as said first potential level and an active pull-down means connected between said signal line and the other of said two sources supplying a low voltage as said second potential level, and said active pull-up means and said active pull-down means are selectively responsive to said first and second control signals for connecting said signal line to said other of said two sources, wherein said active pull-up means is responsive to said first control signal for supplying said high voltage to said signal line as said preliminary level, said active pull-up means has a first transistor connected between said one of said two sources and said signal line and responsive to said first control signal for changing a current path thereof between on-state and off-state, and said active pull-down means has a second transistor connected to said other of said two sources and responsive to said first control signal for changing a current path thereof between on-state and off-state complementarily to said first transistor and a third transistor connected between said second transistor and said signal line and responsive to said second control signal for changing a current path thereof between on-state and off-state.

5. The signal transition accelerating driver circuit as set forth in claim 4, in which said first transistor, said second transistor and said third transistor are a p-channel enhancement type field effect transistor, an n-channel enhancement type field effect transistor and an n-channel enhancement type field effect transistor, respectively.

6. The signal transition accelerating driver circuit as set forth in claim 4, in which said controller has a first logic gate for producing said first control signal from a clock signal alternately defining said first phase and said second phase, a second logic gate for producing an inverted signal of said third control signal, a third logic gate supplied with said inverted signal and said data signal and carrying out a logical operation on said inverted signal and said data signal for producing an output signal, and a fourth logic gate enabled with said preliminary level for producing said second control signal from said output signal in the presence of said third control signal at said third potential level, said fourth logic gate being further enabled with said output signal for producing said second control signal from said potential level on said signal line in the presence of said third control signal at said fourth potential level.

7. The signal transition accelerating driver circuit as set forth in claim 6, in which said first logic gate, said second logic gate, said third logic gate and said fourth logic gate are an inverter, an inverter, an OR gate and a NAND gate, respectively.

8. A signal transition accelerating driver circuit comprising:

an output driver connected between two sources having respective first and second potential levels different from each other, and a signal line to be driven, and having a first phase of operation for giving a preliminary level to said signal line in response to a first control signal and a second phase of operation for fixing said signal line to one of said first and second potential levels in response to a second control signal; and a controller changing said first control signal between a first level indicative of said first phase of operation and a second level indicative of said second phase of operation, and responsive to a third control signal of a third potential level for producing said second control signal on the basis of a data signal and to said third control signal of a fourth potential level for producing said second control signal on the basis of a fifth potential level on said signal line, wherein said output driver includes an active pull-up means connected between said signal line and one of said two sources supplying a high voltage as said first potential level and an active pull-down means connected between said signal line and the other of said two sources supplying a low voltage as said second potential level, and said active pull-up means and said active pull-down means are selectively responsive to said first and second control signals for connecting said signal line to said other of said two sources, wherein said active pull-up means is responsive to said first control signal for supplying said high voltage to said signal line as said preliminary level, said active pull-up means has a first transistor connected between said one of said two sources and said signal line and responsive to a first control signal for changing a current path thereof in on-state and off-state, and said active pull-down means has a second transistor connected between said other of said two sources and said signal line and responsive to said second control signal for changing a current path thereof between said on-state and said off-state, said first transistor and said second transistor being in said on-state and said off-state, respectively, in said first phase, said second transistor being changed between said on-state and said off-state depending upon said data signal in the presence of said third control signal as said third potential level in said second phase, and said second transistor changing said current path from said off-state to said on-state when said potential level on said signal line becomes lower than a predetermined level between a high level and a low level in the presence of said third control signal at said fourth potential level in said second phase.

9. The signal transition accelerating driver circuit as set forth in claim 8, in which said first transistor and said second transistor are a p-channel enhancement type field effect transistor and an n-channel enhancement type field effect transistor, respectively.

10. The signal transition accelerating driver circuit as set forth in claim 8, in which said controller includes
   a first logic gate for producing said first control signal from a clock signal alternately defining said first phase and said second phase,
   a second logic gate for producing an inverted signal of said third control signal,
   a third logic gate supplied with said inverted signal and said data signal for producing a first output signal and enabled with said inverted signal for changing said first output signal depending upon said data signal in the presence of said third control signal at said third level,
   a fourth logic gate supplied with said first output signal and said potential level on said signal line for producing a second output signal and enabled with said preliminary level for changing said second output signal depending upon said first output signal in the presence of said third control signal at said third level and with said first output signal for changing said second output signal depending upon said potential level on said signal line in the presence of said third control signal at said fourth level, and
   a fifth logic gate disabled with said clock signal for producing said second control signal in said first phase and enabled with said clock signal in said second phase for producing said second control signal from said second output signal.

11. The signal transition accelerating driver circuit as set forth in claim 10, in which said first logic gate, said second logic gate, said third logic gate, said fourth logic gate and said fifth logic gate are an inverter, an inverter, an OR gate, an AND gated and a NOR gate, respectively.

12. A signal transition accelerating driver circuit comprising:
   an output driver connected between two sources having respective first and second potential levels different from each other, and a signal line to be driven, and having a first phase of operation for giving a preliminary level to said signal line in response to a first control signal and a second phase of operation for fixing said signal line to one of said first and second potential levels in response to a second control signal; and
   a controller changing said first control signal between a first level indicative of said third control signal of a fourth potential level for producing said second control signal on the basis of a fifth potential level on said signal line,
   wherein said output driver includes
      an active pull-up means connected between said signal line and one of said two sources supplying a high voltage as said first potential level and an active pull-down means connected between said signal line and the other of said two sources supplying a low voltage as said second potential level, and said active pull-up means and said active pull-down means are selectively responsive to said first and second control signals for connecting said signal line to said other of said two sources,
   wherein said active pull-up means in responsive to said first control signal for supplying said high voltage to said signal line as said preliminary level,
   said active pull-up means has
      a first transistor connected between said one of said two sources and said signal line and responsive to a first sub-signal of said first control signal for keeping a current path thereof in on-state in said first phase and off-state in said second phase, and
      a second transistor connected in parallel to said first transistor and responsive to a second sub-signal of said first control signal for changing a current path thereof between on-state and off-state in said second phase, and
   said active pull-down means has
      a third transistor connected to said other of said two sources and responsive to said first sub-signal of said first control signal for changing a current path thereof between on-state and off-state complementarily to said first transistor, and
      a fourth transistor connected between said third transistor and said signal line and responsive to said second control signal for changing a current path thereof between on-state and off-state complementarily to said second transistor in the presence of said third control signal at said third potential level in said second phase,
   said second sub-signal of said first control signal causing said second transistor to turn off in the presence of said third control signal at said fourth potential level in said second phase,
   said second transistor and said fourth transistor being complementarily changed between said on-state and said off-state depending upon said data signal in the presence of said third control signal at said third potential level in said second phase,
   said second control signal causing said fourth transistor to turn on when said fifth potential level on said signal line becomes lower than a predetermined level between a high level and a low level in the presence of said third control signal at said fourth potential level in said second phase.

13. The signal transition accelerating driver circuit as set forth in claim 12, in which said first transistor, said second transistor, said third transistor and said fourth transistor are a p-channel enhancement type field effect transistor, a p-channel enhancement type field effect transistor, an n-channel enhancement type field effect transistor and an n-channel enhancement type field effect transistor, respectively.

14. The signal transition accelerating driver circuit as set forth in claim 8, in which said controller includes
   a first logic gate for producing said first sub-signal of said first control signal from a clock signal alternately defining said first phase and said second phase,
   a second logic gate for carrying out a logic operation on said data signal and said third control signal for producing said second sub-signal of said first control signal,
   a third logic gate for producing an inverted signal from said third control signal, a fourth logic gate supplied with said inverted signal and said data signal for producing an output signal, enabled with said inverted signal in the presence of said third control signal at said third potential level for changing said output signal depending upon said data signal, and a fifth logic gate supplied with said output signal and said fifth potential level on said signal line and enabled with said preliminary level for changing said second control signal depending upon said output signal in the presence of said third control signal at said third level and with said output signal for changing said second control signal depending upon said potential level in the presence of said third control signal at said fourth potential level.

15. The signal transition accelerating driver circuit as set forth in claim 14, in which said first logic gate, said second logic gate, said third logic gate, said fourth logic gate and said fifth logic gate are an inverter, a NAND gate, an inverter, an OR gated and a NAND gate, respectively.

16. A signal transition accelerating driver circuit comprising:

an output driver connected between two sources having respective first and second potential levels different from each other, and a signal line to be driven, and having a first phase of operation for giving a preliminary level to said signal line in response to a first control signal and a second phase of operation for fixing said signal line to one of said first and second potential levels in response to a second control signal; and a controller changing said first control signal between a first level indicative of said first phase of operation and a second level indicative of said second phase of operation, and responsive to a third control signal of a third potential level for producing said second control signal on the basis of a data signal and to said third control signal of a fourth potential level for producing said second control signal on the basis of a fifth potential level on said signal line, wherein said output driver includes an active pull-up means connected between said signal line and one of said two sources supplying a high voltage as said first potential level and an active pull-down means connected between said signal line and the other of said two sources supplying a low voltage as said second potential level, and said active pull-up means and said active pull-down means are selectively responsive to said first and second control signals for connecting said signal line to said other of said two sources, wherein said active pull-down means is responsive to said first control signal for supplying said low voltage to said signal line as said preliminary level, said active pull-up means has a first transistor connected to one of said two sources and responsive to said first control signal for keeping a current path thereof in on-state in said second phase and off-state in said first phase, and a second transistor connected between said first transistor and said signal line and responsive to said second control signal for changing a current path thereof between on-state and off-state in said second phase, and said active pull-down means has a third transistor connected between said signal line and said other of said two sources and responsive to said first control signal for changing a current path thereof between on-state and off-state complementarily to said first transistor in said first phase.

17. The signal transition accelerating driver circuit as set forth in claim 16, in which said first transistor, said second transistor and said third transistor are a p-channel enhancement type field effect transistor, a p-channel enhancement type field effect transistor and an n-channel enhancement type field effect transistor, respectively.

18. The signal transition accelerating driver circuit as set forth in claim 16, in which said controller includes a conductive line for transferring a clock signal alternately defining said first phase and said second phase to said first transistor and said third transistor as said first control signal, a first logic gate supplied with said third control signal and said data signal for producing an output signal, and a second logic gate supplied with said output signal and said potential level on said signal line for producing said second control signal and enabled with said preliminary level for changing said second control signal depending upon said output signal in the presence of said third control signal at said third level and with said output signal for changing said second control signal depending upon said potential level in the presence of said third control signal at said fourth level.

19. The signal transition accelerating driver circuit as set forth in claim 18, in which said first logic gate and said second logic gate are an AND gate and a NOR gate, respectively.

20. A signal transition accelerating driver circuit comprising:

an output driver connected between two sources having respective first and second potential levels different from each other, and a signal line to be driven, and having a first phase of operation for giving a preliminary level to said signal line in response to a first control signal and a second phase of operation for fixing said signal line to one of said first and second potential levels in response to a second control signal; and a controller changing said first control signal between a first level indicative of said first phase of operation and a second level indicative of said second phase of operation, and responsive to a third control signal of a third potential level for producing said second control signal on the basis of a data signal and to said third control signal of a fourth potential level for producing said second control signal on the basis of a fifth potential level on said signal line, wherein said output driver includes an active pull-up means connected between said signal line and one of said two sources supplying a high voltage as said first potential level and an active pull-down means connected between said signal line and the other of said two sources supplying a low voltage as said second potential level, and said active pull-up means and said active pull-down means are selectively responsive to said first and second control signals for connecting said signal line to said other of said two sources, wherein said active pull-down means is responsive to said first control signal for supplying said low voltage to said signal line as said preliminary level, said active pull-up means has a first transistor connected to one of said two sources and responsive to said first control signal for keeping a current path thereof in off-state in said first phase and on-state in said second phase, and a second transistor connected between said first transistor and said signal line and responsive to a first control sub-signal of said second control signal for changing a current path between on-state and off-state in said second phase, and said active pull-down means has a third transistor connected between said signal line and said other of said two sources and responsive to said first control signal for keeping a current path thereof between on-state in said first phase and off-state in said second phase, and a fourth transistor connected in parallel to said third transistor between said signal line and said other of said two sources and responsive to a second control sub-signal of said second control signal for changing a current path thereof between on-state and off-state in said second phase, said first control sub-signal and said second control sub-signal causing said second transistor and said fourth transistor to complementarily turn on and off depending upon said data signal in the presence of said third control signal at said third potential level, said first control sub-signal causing said second transistor to turn on when said fifth potential level on said signal line becomes higher than a predetermined level between said high level and said low level in the presence of said third control signal at said fourth potential level, said second control sub-signal causing said fourth transistor to turn off in the presence of said third control signal at said fourth potential level.

21. The signal transition accelerating driver circuit as set forth in claim 20, in which said first transistor, said second transistor, said third transistor and said fourth transistor are a p-channel enhancement type field effect transistor, a p-channel enhancement type field effect transistor, an n-channel enhancement type field effect transistor and an n-channel enhancement type field effect transistor, respectively.

22. The signal transition accelerating driver circuit as set forth in claim 20, in which said controller includes a conductive line for transferring a clock signal alternately defining said first phase and said second phase to said first transistor and said third transistor as said first control signal, a first logic gate supplied with said data signal and said third control signal for producing an output signal, a second logic gate enabled with said preliminary level for changing said first control sub-signal of said second control signal depending upon said output signal in the presence of said third control signal at said third potential level and with said output signal for changing said first control sub-signal of said second control signal depending upon said fifth potential level on said signal line in the presence of said third control signal at said fourth potential level, a third logic gate for producing an inverted signal of said third control signal, and a fourth logic gate supplied with said inverted signal and said data signal for producing said second control sub-signal of said second control signal in the presence of said third control signal at said third potential level.

23. The signal transition accelerating driver circuit as set forth in claim 22, in which said first logic gate, said second logic gate, said third logic gate and said fourth logic gate are an AND gate, a NOR gate, an inverter and a NOR gate, respectively.

24. A driver system for changing a potential level on a signal line, comprising:

at least one first driver circuit including a first output driver connected between two sources of potential level different in potential level and said signal line to be driven and having a first phase of operation for providing a preliminary level to said signal line in response to a first control signal and a second phase of operation for fixing said signal line to the respective first and second potential levels of one of said two sources in response to a second control signal, and a first controller changing said first control signal between a first level indicative of said first phase of operation and a second level indicative of said second phase of operation and responsive to a third control signal of a third potential level for producing said second control signal on the basis of a first data signal and to said third control signal of a fourth potential level for producing said second control signal on the basis of a fifth potential level on said signal line;

at least one second driver circuit including a second output driver connected between said two sources of potential level and said signal line and having said first phase for providing said preliminary level to said signal line in response to said first control signal and said second phase of operation for fixing said signal line to the potential level of one of said two sources in response to a fourth control signal, and a second controller changing said first control signal between said first potential level and said second potential level and responsive to a fifth control signal for producing said second control signal on the basis of said fifth potential level on said signal line; and at least one third driver circuit including a third output driver connected between said two sources of potential level and said signal line and having said first phase for providing said preliminary level to said signal line in response to a sixth control signal and said second phase of operation for fixing said signal line to the potential level of one of said two sources in response to a seventh control signal, and a third controller changing said sixth control signal between said first potential level and said second potential level and responsive to an eighth control signal complementary to said third control signal and having said third potential level for producing said eighth control signal on the basis of a second data signal and said fourth potential level for producing said sixth control signal on the basis of said fifth potential level on said signal line.

* * * * *